(12) United States Patent
Konstantinov

(10) Patent No.: US 11,894,454 B2
(45) Date of Patent: Feb. 6, 2024

(54) SILICON CARBIDE FIELD-EFFECT TRANSISTORS

(71) Applicant: SEMICONDUCTOR COMPONENTS INDUSTRIES, LLC, Phoenix, AZ (US)

(72) Inventor: Andrei Konstantinov, Sollentuna (SE)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 311 days.

(21) Appl. No.: 17/448,916

(22) Filed: Sep. 27, 2021

(65) Prior Publication Data

US 2022/0013661 A1 Jan. 13, 2022

Related U.S. Application Data

(63) Continuation of application No. 16/667,664, filed on Oct. 29, 2019, now Pat. No. 11,139,394.

(Continued)

(51) Int. Cl.
*H01L 29/78* (2006.01)
*H01L 29/45* (2006.01)
(Continued)

(52) U.S. Cl.
CPC ...... *H01L 29/7802* (2013.01); *H01L 29/1608* (2013.01); *H01L 29/456* (2013.01); *H01L 29/4966* (2013.01); *H01L 29/802* (2013.01)

(58) Field of Classification Search
CPC ........... H01L 29/04–45; H01L 29/1058; H01L 29/1066; H01L 29/16–1608;
(Continued)

(56) References Cited

U.S. PATENT DOCUMENTS 5,681,762 A * 10/1997 Baliga ................. H01L 29/7802
257/E21.054
5,915,164 A * 6/1999 Taskar .................. H01L 29/802
257/E29.062

(Continued)

OTHER PUBLICATIONS

"High-pure AlN Crystalline Thin Films Deposited on GaN at Low Temperature by Plasma-enhanced ALD", Xiaohong Zeng, Ying Wu, Gaohang He, Wenqing Zhu, Sunan Ding, Zhongming Zeng, Elsevier, vol. 213, Shanghai, China (Year: 2023).*

(Continued)

*Primary Examiner* — Maliheh Malek
(74) *Attorney, Agent, or Firm* — Brake Hughes Bellermann LLP

(57) ABSTRACT

In a general aspect, a silicon carbide (SiC) metal-oxide-semiconductor field-effect transistor (MOSFET) can include a substrate of a first conductivity type, a drift region of the first conductivity type disposed on the substrate, a spreading layer of the first conductivity type disposed in the drift region, a body region of a second conductivity type disposed in the spreading layer, and a source region of the first conductivity type disposed in the body region. The SiC MOSFET can also include a gate structure that includes a gate oxide layer, an aluminum nitride layer disposed on the gate oxide layer, and a gallium nitride layer of the second conductivity disposed on the aluminum nitride layer.

20 Claims, 19 Drawing Sheets

Related U.S. Application Data

(60) Provisional application No. 62/894,017, filed on Aug. 30, 2019.

(51) Int. Cl.
*H01L 29/16* (2006.01)
*H01L 29/49* (2006.01)
*H01L 29/80* (2006.01)

(58) Field of Classification Search
CPC ... H01L 29/18–185; H01L 29/22–2206; H01L 29/36–365; H01L 29/66893–66924; H01L 29/8086; H01L 27/098; H01L 27/14679; H01L 2924/13062; H01L 27/2454; H01L 29/7827; H01L 29/7802; H01L 29/456; H01L 29/4966; H01L 29/0696; H01L 29/66068; H01L 29/267; H01L 29/802
See application file for complete search history.

(56) References Cited

U.S. PATENT DOCUMENTS

| | | | |
|---|---|---|---|
| 6,117,735 A * | 9/2000 | Ueno | H01L 29/8083 257/E29.313 |
| 6,303,947 B1 * | 10/2001 | Ueno | H01L 29/66068 257/E29.313 |
| 6,552,363 B2 * | 4/2003 | Sridevan | H01L 29/0878 257/E29.081 |
| 7,772,621 B2 * | 8/2010 | Treu | H01L 29/7395 257/E29.313 |
| 9,324,807 B1 * | 4/2016 | Bhalla | H01L 27/0629 |
| 9,425,153 B2 * | 8/2016 | Matocha | H01L 23/3192 |
| 9,484,413 B2 * | 11/2016 | Van Brunt | H01L 21/324 |
| 9,620,428 B2 * | 4/2017 | Matocha | H01L 29/7395 |
| 9,768,259 B2 * | 9/2017 | Suvorov | H01L 29/0878 |
| 9,780,181 B1 * | 10/2017 | Teo | H01L 29/2003 |
| 10,211,301 B1 * | 2/2019 | Shimizu | H01L 21/049 |
| 10,217,824 B2 * | 2/2019 | Suvorov | H01L 21/047 |
| 10,332,876 B2 * | 6/2019 | Siemieniec | H01L 29/7786 |
| 10,504,995 B1 * | 12/2019 | Domeij | H01L 29/66068 |
| 10,707,340 B2 * | 7/2020 | Konstantinov | H01L 21/046 |
| 10,749,002 B2 * | 8/2020 | Domeij | H01L 29/1608 |
| 10,790,143 B1 * | 9/2020 | Lin | H01L 21/02458 |
| 10,872,823 B2 * | 12/2020 | Gu | H01L 29/0843 |
| 11,145,657 B1 * | 10/2021 | Or-Bach | H01L 21/823475 |
| 11,476,369 B2 * | 10/2022 | Konstantinov | H01L 29/8083 |
| 11,631,667 B2 * | 4/2023 | Or-Bach | H01L 27/0688 257/347 |
| 2003/0006409 A1 * | 1/2003 | Ohba | H01L 21/02502 257/E21.127 |
| 2004/0164415 A1 * | 8/2004 | Teraguchi | H01L 21/28575 257/745 |
| 2005/0067630 A1 * | 3/2005 | Zhao | H01L 29/1066 257/E29.313 |
| 2006/0011915 A1 * | 1/2006 | Saito | H01L 29/1066 257/E29.252 |
| 2008/0173876 A1 * | 7/2008 | Ueno | H01L 29/7803 257/77 |
| 2009/0078971 A1 * | 3/2009 | Treu | H01L 29/8083 257/E29.313 |
| 2009/0146154 A1 * | 6/2009 | Zhang | H01L 29/045 257/77 |
| 2010/0258841 A1 * | 10/2010 | Lidow | H01L 29/66462 257/192 |
| 2012/0161208 A1 * | 6/2012 | Veliadis | H01L 29/2003 257/E21.445 |
| 2013/0075756 A1 * | 3/2013 | Arthur | H01L 29/78 257/77 |
| 2013/0342262 A1 * | 12/2013 | Konstantinov | H03K 17/0414 327/375 |
| 2014/0008658 A1 * | 1/2014 | Siemieniec | H01L 29/1054 257/E29.089 |
| 2014/0191241 A1 * | 7/2014 | Edwards | H01L 29/0692 257/265 |
| 2014/0210008 A1 * | 7/2014 | Oritsuki | H01L 21/0465 438/237 |
| 2014/0361337 A1 * | 12/2014 | Sugiyama | H01L 21/02507 257/190 |
| 2015/0021621 A1 * | 1/2015 | Adekore | H01L 29/8083 438/268 |
| 2015/0060876 A1 * | 3/2015 | Xing | H01L 29/7787 257/76 |
| 2015/0084066 A1 * | 3/2015 | Banerjee | H01L 29/8083 257/77 |
| 2015/0349062 A1 * | 12/2015 | Konstantinov | H01L 29/7811 257/77 |
| 2015/0372092 A1 * | 12/2015 | Yamamoto | H01L 21/0485 257/77 |
| 2017/0040312 A1 * | 2/2017 | Curatola | H01L 29/66143 |
| 2017/0125545 A1 * | 5/2017 | Yamada | H01L 29/7786 |
| 2017/0125574 A1 * | 5/2017 | Chowdhury | H01L 29/7787 |
| 2017/0213917 A1 * | 7/2017 | Bhalla | H01L 29/1066 |
| 2017/0236951 A1 * | 8/2017 | Sun | H01L 29/66666 257/76 |
| 2017/0352754 A1 * | 12/2017 | Beach | H01L 29/7787 |
| 2018/0219071 A1 * | 8/2018 | Ye | H01L 29/205 |
| 2018/0233591 A1 * | 8/2018 | Watanabe | H01L 29/7788 |
| 2018/0254326 A1 * | 9/2018 | Dong | H01L 29/7781 |
| 2019/0081039 A1 * | 3/2019 | Siemieniec | H01L 29/66068 |
| 2019/0081164 A1 * | 3/2019 | Shrivastava | H01L 29/778 |
| 2019/0109208 A1 * | 4/2019 | Wang | H01L 29/205 |
| 2019/0288104 A1 * | 9/2019 | Kinoshita | H01L 29/1608 |
| 2019/0296141 A1 * | 9/2019 | Rupp | H01L 29/32 |
| 2019/0334024 A1 * | 10/2019 | Jiang | H01L 29/0657 |
| 2019/0371889 A1 * | 12/2019 | Narita | H01L 29/66734 |
| 2020/0013723 A1 * | 1/2020 | Fuergut | H01L 23/53238 |
| 2020/0058783 A1 * | 2/2020 | Ozaki | H01L 23/291 |
| 2020/0083365 A1 * | 3/2020 | Konstantinov | H01L 29/7806 |
| 2020/0219972 A1 * | 7/2020 | Leendertz | H01L 29/0619 |
| 2020/0259012 A1 * | 8/2020 | Pala | H01L 29/7803 |
| 2020/0287035 A1 * | 9/2020 | Onomura | H01L 21/02381 |
| 2020/0303541 A1 * | 9/2020 | Okumura | H01L 29/0684 |
| 2020/0381519 A1 * | 12/2020 | Hayashida | H01L 29/66734 |
| 2020/0402974 A1 * | 12/2020 | Mitchell, Jr. | H04B 7/18517 |
| 2021/0035882 A1 * | 2/2021 | Schaetz | H01L 29/42364 |
| 2022/0013663 A1 * | 1/2022 | Kawahara | H01L 29/66068 |
| 2022/0028976 A1 * | 1/2022 | Wirths | H01L 29/66333 |
| 2022/0131015 A1 * | 4/2022 | Konstantinov | H01L 29/8083 |
| 2022/0328411 A1 * | 10/2022 | Or-Bach | H01L 27/092 |
| 2023/0055024 A1 * | 2/2023 | Konstantinov | H01L 29/1045 |
| 2023/0081211 A1 * | 3/2023 | Pei | H01L 29/2003 257/76 |
| 2023/0087937 A1 * | 3/2023 | Lichtenwalner | H01L 29/7802 257/329 |

OTHER PUBLICATIONS

Wei, Jin, et al., "Proposal of a GAN/SIC Hybrid Field-Effect Transistor for Power Switching Applications", IEEE Transactions on Electron Devices, vol. 63, No. 6, Jun. 2016, pp. 2469-2473.

R. Y. Khosa et al., "Electrical characterization of MOCVD grown single crystalline AlN thin film on 4H-SiC," Jul. 2019.

S. Madhusoodhanan et al., "A Highly Linear Temperature Sensor Using GaN-on-SiC Heterojunction Diode for High Power Applications," IEEE Electron Device Letters, vol. 38, No. 8, Aug. 2017.

A. O. Konstantinov et al., "Ionization rates and critical fields in 4H silicon carbide," American Institute of Physics, May 7, 1997.

* cited by examiner

SILICON CARBIDE FIELD-EFFECT TRANSISTORS

RELATED APPLICATIONS

This application is a continuation of U.S. patent application Ser. No. 16/667,664, filed on Oct. 29, 2019, entitled "SILICON CARBIDE FIELD-EFFECT TRANSISTORS," which claims priority to and the benefit of U.S. Provisional Application No. 62/894,017, filed on Aug. 30, 2019, and entitled "SILICON CARBIDE FIELD-EFFECT TRANSISTORS," both of which are incorporated by reference herein in their entireties.

TECHNICAL FIELD

This description relates to silicon carbide (SiC) semiconductor devices that include field-effect transistors (FETs) having a built-in channel.

BACKGROUND

In power field-effect transistors (FETs) the use of silicon carbide (SiC) as a semiconductor material can decrease static and dynamic power losses. Such FETs can be used in various power applications, such as electric motor drive control, where it is desirable that under zero-bias (e.g., on a gate or control terminal) are normally off. In current implementations, normally off power SiC FETs are typically implemented using metal-oxide-semiconductor FET (MOSFET) designs. However, SiC MOSFETs have reliability issues (e.g., due to overstress of gate oxide) and issues related to implementation in motor drive control applications (e.g., low short-circuit survival time). Furthermore, current SiC MOSFETs can also be expensive to implement due to low inversion-layer carrier mobility (e.g., bulk mobility) resulting in high specific on-resistance. ($R_{spon}$). This high $R_{spon}$ is addressed by increasing device size (e.g., increase channel width) to achieve lower channel resistance and desired current ratings for such SiC MOSFETs. SiC junction FETs (JFETs) are not susceptible to the reliability issues of SiC MOSFETs and can have much higher bulk carrier mobility (e.g., lower $R_{spon}$). However, normally off operation of current SiC JFETs can be problematic. Further, current SiC JFET implementations can have low threshold voltages, as well as with low on-state currents, making them unsuitable for use in power device applications, such as motor drive control.

SUMMARY

In a general aspect, a silicon carbide (SiC) metal-oxide-semiconductor field-effect transistor (MOSFET) can include a substrate of a first conductivity type, a drift region of the first conductivity type disposed on the substrate, a spreading layer of the first conductivity type disposed in the drift region, a body region of a second conductivity type disposed in the spreading layer, and a source region of the first conductivity type disposed in the body region. The SiC MOSFET can also include a gate structure that includes a gate oxide layer, an aluminum nitride layer disposed on the gate oxide layer, and a gallium nitride layer of the second conductivity disposed on the aluminum nitride layer.

In another general aspect, a silicon carbide (SiC) metal-oxide-semiconductor field-effect transistor (MOSFET) can include an n-type substrate, an n-type drift region disposed on the substrate, an n-type spreading layer disposed in the n-type drift region, a p-type body region disposed in the n-type spreading layer, and an n-type source region disposed in the p-type body region. The SiC MOSFET can also include a gate structure that includes a gate oxide layer, an aluminum nitride layer disposed on the gate oxide layer, and a p-type gallium nitride layer disposed on the aluminum nitride layer.

Figure 1:
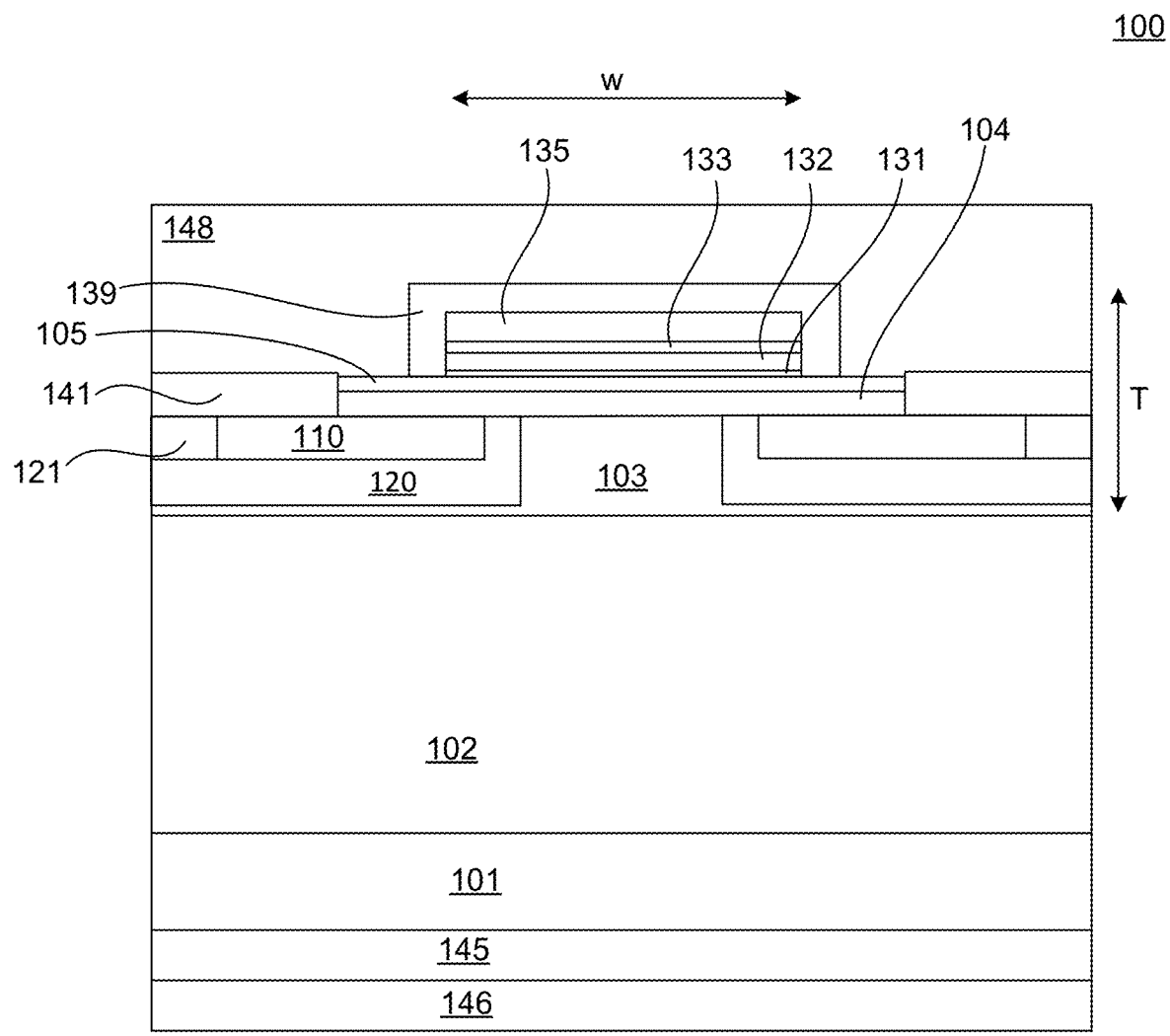
FIG. 1 is a diagram that schematically illustrates a side cross-sectional view of a silicon carbide (SiC) field-effect transistor (FET), according to an implementation.

In the drawings, which are not necessarily drawn to scale, like reference symbols may indicate like and/or similar components (elements, structures, etc.) in different views. The drawings illustrate generally, by way of example, but not by way of limitation, various implementations discussed in the present disclosure. Reference symbols shown in one drawing may not be repeated for the same, and/or similar elements in related views. Reference symbols that are repeated in multiple drawings may not be specifically discussed with respect to each of those drawings, but are provided for context between related views. Also, not all like

DETAILED DESCRIPTION

The present disclosure is directed to silicon carbide (SiC) field-effect transistors FETs (e.g., JFETs, junction-gated FETs, gate-controlled JFETs, and so forth) that overcome at least some of the drawbacks of current devices noted above. In some implementations, the SiC FETs described herein can be used in high power applications, such as applications with a desired blocking voltage (e.g., under reverse bias conditions of a rectifying diode of the FET) of 600 volts (V) or greater. Such SiC power FETs can also have low on-state specific resistance ($R_{spon}$) so as to allow for high operation current for a power device of sufficiently small area to be cost effective as compared with current devices.

In some implementations, the FETs described herein can have electrical performance parameters that are near-theoretical performance, e.g., with respect to blocking voltage and on-state resistance. For instance, a theoretical value limit for $R_{spon}$ of a vertical non-injection power device (e.g., such as the SiC FETs described herein) can be determined based on a resistance of a drift region of the power device. For instance, $R_{spon}$ for a non-punch-through power device can be given by Equation 1 below:

$$R_{spon} = 4BV^2/(\text{epsilon} * mu * E_c^3) \quad \text{Equation 1,}$$

where BV is the breakdown voltage, epsilon is the absolute permittivity of a semiconductor material (e.g., SiC) in which the device is formed, mu is the bulk carrier mobility (e.g., electrons for an n-type device), and $E_c$ is a critical electric field for avalanche breakdown of the semiconductor material. In some implementations, a high-power switch can be defined as a device (e.g., a gate-controlled JFET) having a specific resistance, $R_{spon}$, that does not exceed 10 times the theoretical value of $R_{spon}$ given by Equation 1 above. For purposes of this disclosure, $R_{spon}$ can be defined as a differential resistance of an on-state FET multiplied by an active area (e.g., in square centimeters) of the FET device, where the active area can be determined by multiplying an active area of a unit cell of the FET by a number of unit cells included in the switching device.

In some implementations, such as those described herein, a vertical, SiC FET (e.g., a vertical, gate-controlled JFET) can include an n-type (e.g., topside) source region, an n-type (e.g., backside) drain region, and an n-type vertical drift region. A SiC FET (e.g., a unit cell as shown in FIG. 1) of such a device can further include a shielding p-body, a passive vertical n-type JFET channel (e.g., a spreading region or spreading layer), and a gate-controlled lateral built-in channel on top of the shielding p-body and the vertical JFET channel. The lateral channel can be configured to provide a gate-controlled electrical connection between the (topside) source region and the passive vertical JFET channel (spreading layer). In some implementations, a lateral built-in channel can have a channel depth of nanometer (nm) dimensions, for instance. a channel depth of 100 nm or less (e.g., 20 nm or less).

Such a lateral channel can be controlled by a gate structure that includes a layer of a p-type (magnesium doped) aluminum-gallium nitride (AlGaN) alloy, where the AlGaN layer of the gate structure is separated (spaced) from the built-in channel by a thin aluminum nitride (AlN) buffer, or interface layer. Under zero-bias gate conditions, the lateral channel can be configured such that is pinched off (e.g., not conducting) by a built-in potential of the p-type AlGaN gate. With a positive bias applied to the gate, the lateral channel can be configured to become open (e.g., conduct), providing a continuous electron flow path from the source region to the drain region (e.g., through the lateral channel, the spreading layer, and the drift region). In the implementations described herein, the use of p-type AlGaN gate can provide a high threshold voltage (e.g., greater than 1 V, greater than 2 V, etc.), while the AlN buffer layer can provide a low interface trap density at an interface of the AlN layer and the SiC of the lateral channel, and at an interface the AlN layer and the AlGaN gate layer.

Figure 12:
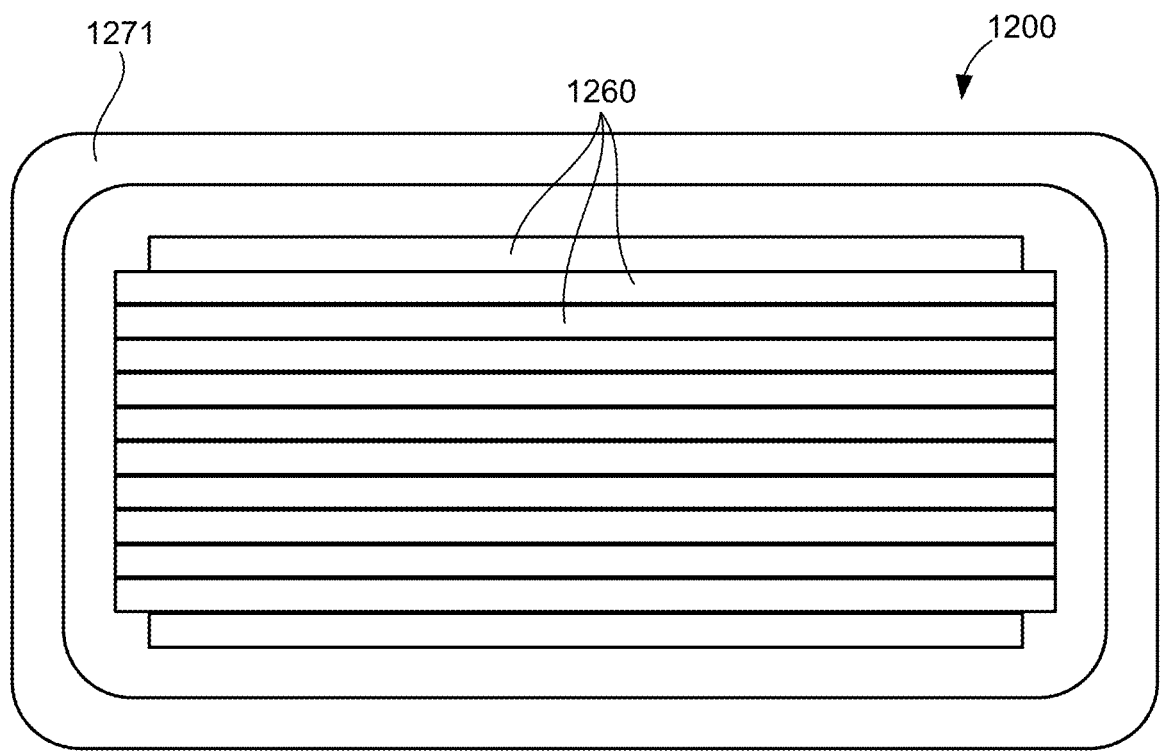
FIG. 12 is a diagram that schematically illustrates a plan view of a SiC FET.

FIG. 1 is a diagram that schematically illustrates a side cross-sectional view of a silicon carbide (SiC) FET 100. For instance, FIG. 1 illustrates a cross-sectional view of an example implementation of a unit cell of a SiC FET. A unit cell of the FET 100, such as shown in FIG. 1, can be combined with other instances of the unit cell (e.g., as illustrated in FIG. 12) to form a gate-controlled SiC JFET that can be used in power applications, such as motor control drivers, industrial controls, etc.

As shown in FIG. 1, the FET 100 includes an n-type (heavily doped) substrate 101, and an n-type epitaxial drift region 102. The FET 100 also includes an n-type spreading layer 103 in an upper portion of the drift region 102. In some implementations, the spreading layer 103 can have a doping concentration that is higher than a doping concentration of the drift region 102. The spreading layer can be formed using ion implantation and/or ion diffusion.

The FET 100 of FIG. 1 also includes p-body regions 120 and source regions 110 that are disposed in the spreading layer 130. The portion of the n-type spreading layer 103 that is disposed between the two p-body regions 120 can also be referred to as a vertical JFET region (vertical JFET channel, etc.). The p-body regions 120 and the source regions 110 can be formed by respective ion implantation operations.

As shown in FIG. 1, the FET 100 also includes an n-type spacer layer 104, that can be formed using SiC regrowth. An n-type (heavily doped) lateral (built-in) channel region 105 can be formed in an upper portion of the spacer layer 104 using ion implantation. In this example implementation, a composite gate structure is arranged on top of the lateral channel region 105. In some implementations (such as in the FET 100), this composite gate structure can include a thin buffer (interface) layer of AlN 131, where a thickness of the AlN layer 131 can be in a range of a few monolayers to tens of nanometers (e.g., 1 to 30 nm).

In the FET 100, the composite gate structure further includes a layer of p-type (heavily doped) aluminum gallium nitride AlGaN 132 that is disposed on the AlN layer 131, where the AlGaN layer 132 defines a heterojunction (PN junction) with the n-type lateral channel region 105. In some implementations, such as in the FET 100, the composite gate structure can further include a layer of p-type (heavily doped) gallium nitride GaN 133 that is disposed on the AlGaN layer 132, and a layer of gate metal 135 that is disposed on, and defines an Ohmic contact to the GaN layer 133. Because GaN has a lower band gap than that of AlGaN alloys, use of the GaN layer 133 as shown in FIG. 1 can reduce contact resistance between the gate metal layer 135 and the underlying elements of the composite gate structure (e.g., as compared to forming an Ohmic contact to the p-type AlGaN layer 132). As is discussed further below, a mole fraction X of AlN in the AlGaN layer 132 can be greater than or equal to eighteen percent (e.g., to achieve conduction band alignment for efficient operation of the FET 100).

As shown in FIG. 1, the FET 100 also includes an Ohmic contact 145 to a drain region of the FET 100, where the substrate 101 operates as the drain region of the FET 100. The FET 100 further includes an Ohmic contact 141 to the source region 110, where the Ohmic contact 141 can also short the p-body regions 120 to respective source regions 110.

Formation of the Ohmic contact 141 to the p-bodies 120 may include forming a p+ subcontact regions 121, where the subcontact regions 121 have a p-type doping concentration that is higher than a p-type doping of the p-bodies 120, so as to reduce contact resistance of the Ohmic contact 141.

The FET 100 further includes source pad metal 148, which can provide electrical connection to the p-bodies 120 (through the Ohmic contacts 141 and the subcontact regions 121) and the source regions 110 for operation of the FET 100. The pad metal 148, in combination with the Ohmic contacts 141, can be referred to as a source metal structure. As shown in FIG. 1, the source pad metal 148 is separated (electrically isolated) from the composite gate structure (e.g., gate stack) by an interlayer dielectric 139. In this implementation, a backside metal layer 146 is disposed on the Ohmic (drain) contact 145. In some implementations, the backside metal layer 146 can facilitate mounting of a semiconductor die including the FET 100 into a semiconductor device package and/or into a semiconductor power module (e.g., a multi-chip module). In some implementations, such a power module may include a power sub-circuit, e.g., a half-bridge or a full bridge circuit topology that is populated with high-power SiC FETs, such as those described herein. Of course, such a power module can also have a different topology than a bridge configuration, and could also contain, e.g., a semiconductor-based driver circuit.

Various details, and variations of SiC FETs (such for the SiC FET 100) are illustrated in the drawings and described below. However, briefly, such SiC FETs, (with reference to the FET 100) can be configured such that, under zero gate bias conditions (e.g., zero bias applied to the composite gate structure via the gate metal layer 135), the lateral channel region 105 can be (fully) depleted (pinched off) by a built in potential of the heterojunction defined the p-type AlGaN layer 132 and the n-type lateral channel region 105. Accordingly, under such zero bias conditions, the FET 100 can remain in an off-state (e.g., not conducting from the source regions 110 to the drain) up to a full blocking voltage rating for a given implementation.

Further, with a positive bias (e.g., greater than 1 V) applied to the gate metal layer 135 (and the p-type GaN layer 133), accumulation of free electrons can occur in the lateral channel region 105, providing a path for electrons to flow from the source regions 110 to the drain (e.g., the substrate 101), where the path for electron flow is through the ohmic contact 141, the lateral channel region 105, the vertical channel (spreading layer) 103, and the drift region 102.

In example implementations of the SiC 100, the drift region 102 can have a depth (thickness from the spreading layer 103 to the substrate 101) along line T in FIG. 1 of approximately 9.5 micrometers (μm). The drift region 102 can have a doping concentration of $1\times10^{16}$ $cm^{-3}$. The lateral channel region 105 can be formed, e.g., using a 30-KeV arsenic (As) implant at a depth of 18 nm (along the line T), with a dose $6\times10^{12}$ $cm^{-2}$. A width of the unit cell (e.g., device pitch) of the FET 100 can be 5 um along line W in FIG. 1. In some implementations of the SiC FET 100, $R_{spon}$ can be less than or equal to 2 milliohm (mOhm) centimeter squared (mOhm·$cm^2$), which can be approximately two times lower than $R_{spon}$ for a SiC MOSFET of a similar blocking voltage rating.

As noted above, the spacer layer 104 can be a regrown SiC layer. In some implementations, the spacer layer 104 (including the lateral channel region 105) can have a thickness between 60 nm and 300 nm, along the line T in FIG. 1. Preferred spacer layer thickness approximately is between 100 nm and 200 nm. The AlGaN layer 132 of the composite gate structure can have a magnesium doping concentration of greater than or equal to $1\times10^{18}$ $cm^{-3}$, which can provide a high transconductance for the composite gate structure. Further, the AlGaN layer 132 can have an AlN mole fraction, $X_{AlN}$ of between 15% and 70%, and $X_{AlN}$ may be a constant value over a thickness of the AlGaN layer 132. In some implementations, the lateral channel region 105 can have a depth, along the line T1 in FIG. 1, of less than or equal to 20 nm. The GaN layer 133 can have a magnesium doping concentration of greater than or equal to $10^{19}$ $cm^{-3}$, or, in some implementations, above $10^{20}$ $cm^{-3}$.

Figure 2:
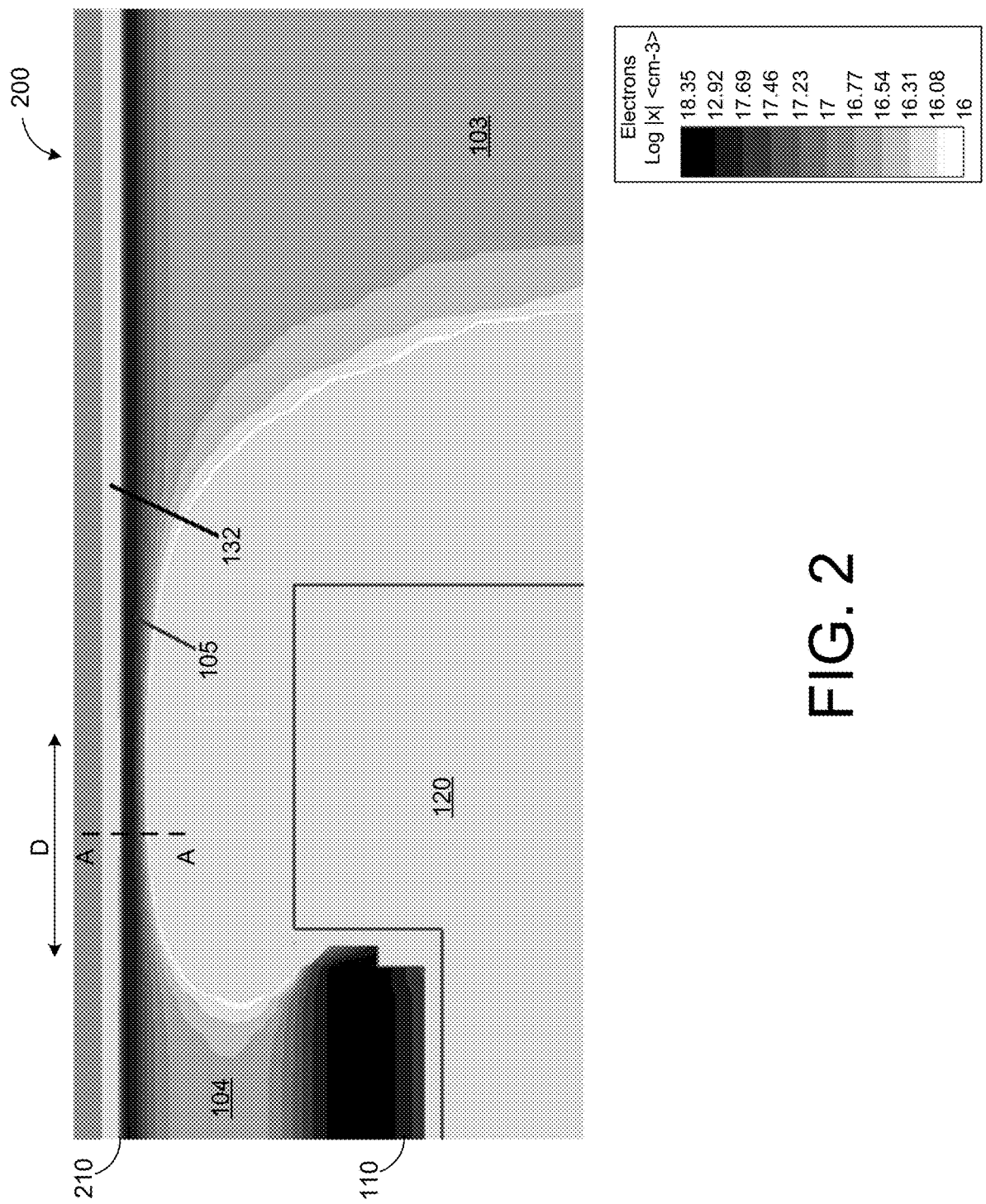
FIG. 2 is a diagram illustrating electron concentration contours for an on-state SiC FET, according to an implementation.

FIG. 2 is a diagram 200 illustrating electron concentration contours for an on-state SiC FET, according to an implementation. For instance, the diagram 200 is a grayscale image showing simulated electron concentrations in an implementation of the SiC FET 100. Darker tones in FIG. 2 represent higher electron concentrations, such as indicated by the legend included in FIG. 2. The simulation of FIG. 2 represents a SiC FET device (e.g., a portion of the SiC FET 100) with a 2.7 V gate bias and a 0 V drain bias (e.g., operation in saturation mode). The 100 series reference numbers in FIG. 2 correspond with those in FIG. 1. That is, in FIG. 2, the spreading layer 103, the spacer layer 104, the lateral channel region 105, source region 110, p-body region 120 and AlGaN layer 132 are specifically indicated.

The diagram 200 shown in FIG. 2 illustrates formation of a non-depleted lateral channel in the lateral channel region 105, as a result of the effect of the 2.7 V gate bias on the p-type AlGaN layer 132 of the composite gate structure of the FET 100. This was performed for an implementation of the SiC FET 100 with an AlN mole fraction $X_{AlN}$ of thirty percent. The line A-A in FIG. 2 indicates the location of a cross-section for which a conduction band is shown in FIG. 3, and discussed below.

Figure 3:
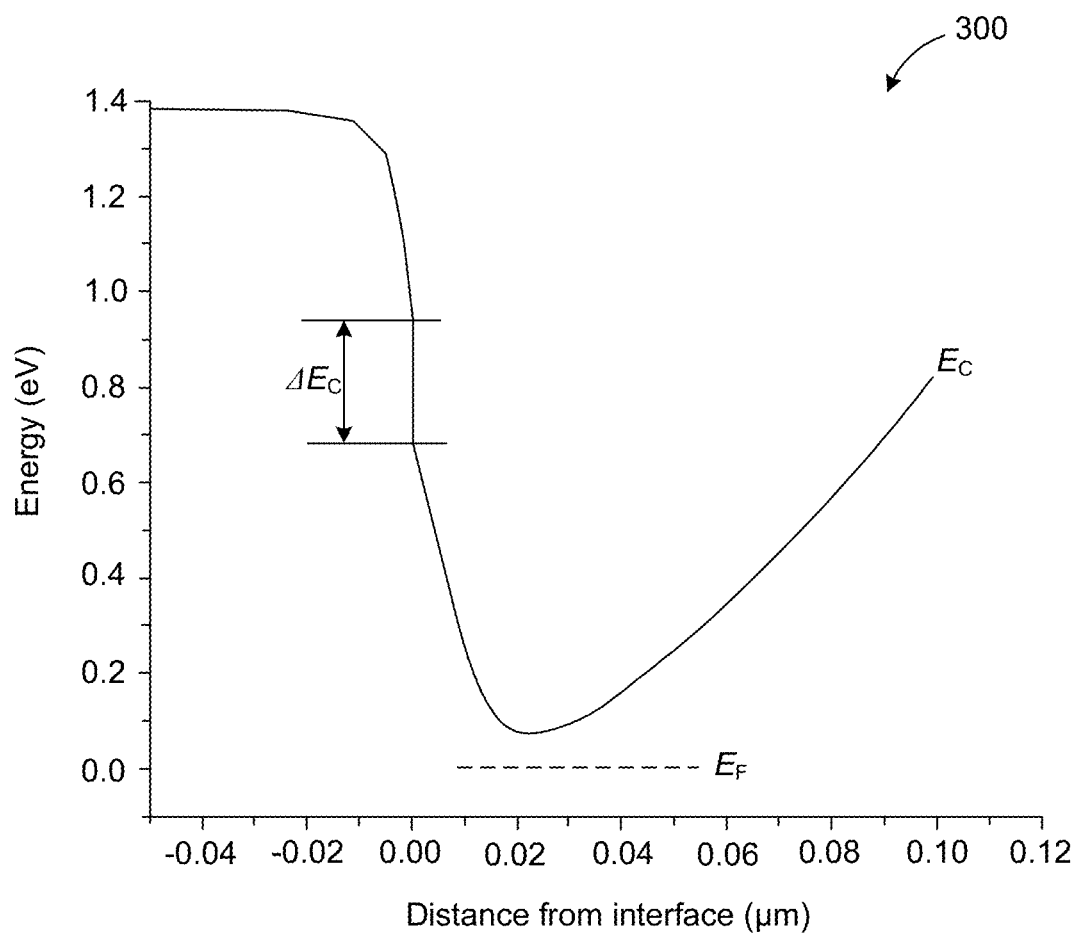
FIG. 3 is a diagram illustrating an on-state conduction band of a SiC FET, according to an implementation.

FIG. 3 is a diagram 300 illustrating characteristics of an on-state conduction band of the SiC FET shown in FIG. 2, according to an implementation. That is, the diagram 300 illustrates electron potential at an edge of the conduction band and a corresponding Fermi level for a cross-section along the line A-A shown in FIG. 2, for an on (open-state, etc.) SiC FET (e.g., operating in saturation mode).

The band diagram 300 shown in FIG. 3 illustrates the potential in electron volts (eV) of an electron conduction band, $E_C$, as a function of a distance from a SiC—AlGaN 210 interface along the line A-A in FIG. 2 (e.g., an interface with the AlGaN layer 132 and the lateral channel region 105). As noted above, in this example, the AlN mole fraction ($X_{AlN}$) in the AlGaN layer 132 is 0.3. As indicated above, the conduction band diagram 300 shown in FIG. 3 is for a cross-section of the SiC FET of FIG. 2 (along the line A-A), which was taken at a lateral distance of 100 nm from the right-hand edge of the source region 110, e.g., along the line D in FIG. 2. In the diagram 300 of FIG. 3, the band diagram is plotted such that x=0 (e.g., on the x-axis of the diagram 300) corresponds to the interface 210 of p-AlGaN to the n-type SiC. In FIG. 3, negative distance numbers correspond to locations in the p-AlGaN along the line A-A in FIG. 2 from the interface 210 into the composite gate structure.

Further, positive distance numbers in FIG. 3 correspond with distances along the line A-A from the interface 210 into the lateral channel region 105, the spacer layer 104 and the p-body region 120. That is, with further reference to FIG. 3, the conduction band profile plotted in FIG. 3 corresponds to a cross-section (along line A-A) over the p-AlGaN layer 132, the lateral channel region 105, the spacer layer 104 and the p-body 120, e.g., of an implementation the SiC FET device 100 as illustrated in FIG. 2.

As shown in FIG. 3, within the channel region 105 (e.g., at a distance of approximately 20 nm from the interface 210), energy of the conduction band Ec approaches the Fermi level $E_F$, which is indicative of high electron concentration in the lateral channel region 105. As is also shown in FIG. 3, a discontinuity, ΔEc, of the conduction band Ec occurs at the interface 210 of the AlGaN layer 132 and SiC of the lateral channel region 105. In some implementations, as is discussed further below, location of such a discontinuity ΔEc can play an important role in controlling a leakage current of a composite gate structure of a SiC FET, such as those SiC FETs described herein.

Figure 4A:
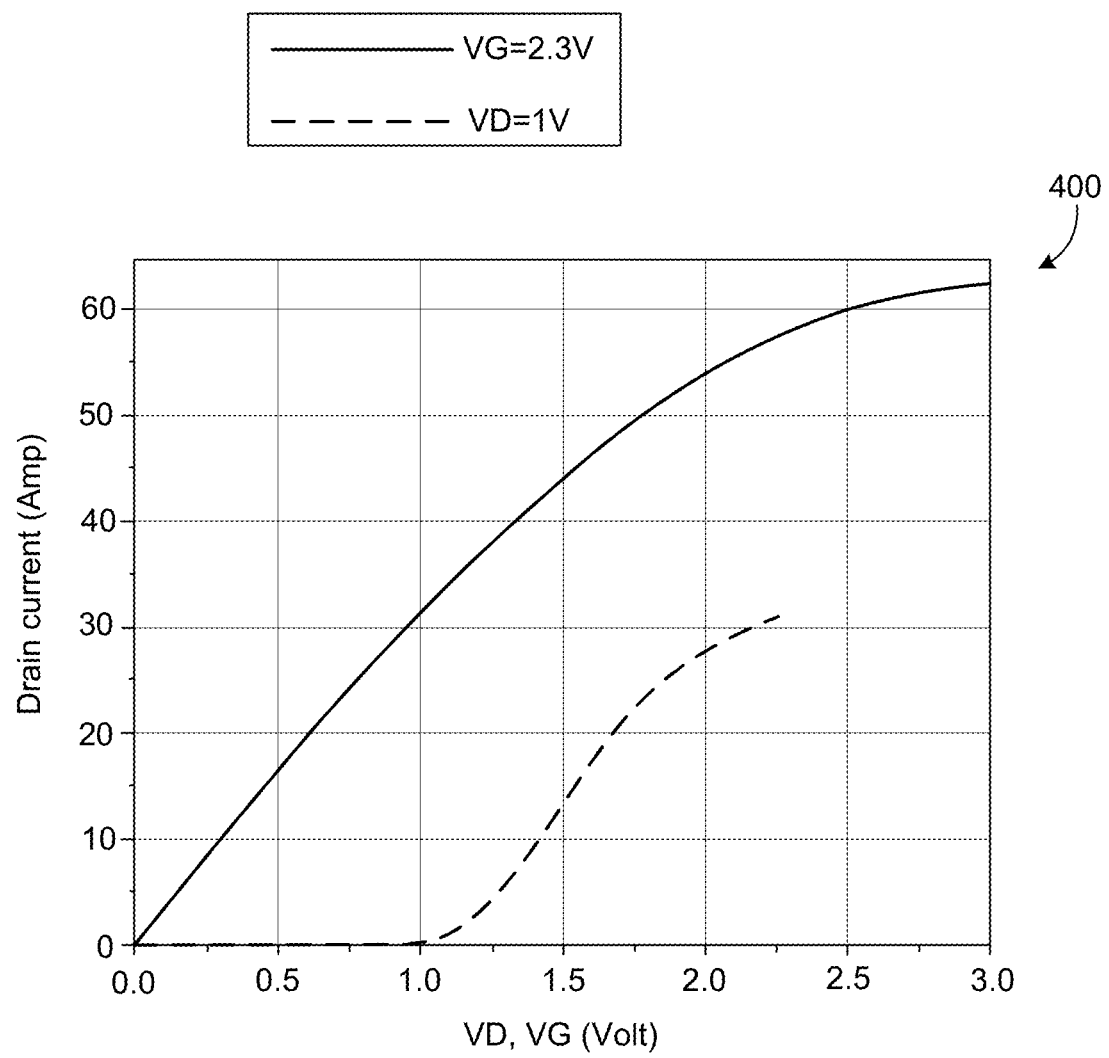
FIG. 4A is a diagram illustrating simulated output on-state characteristics of a SiC FET, according to an implementation.
Figure 4B:
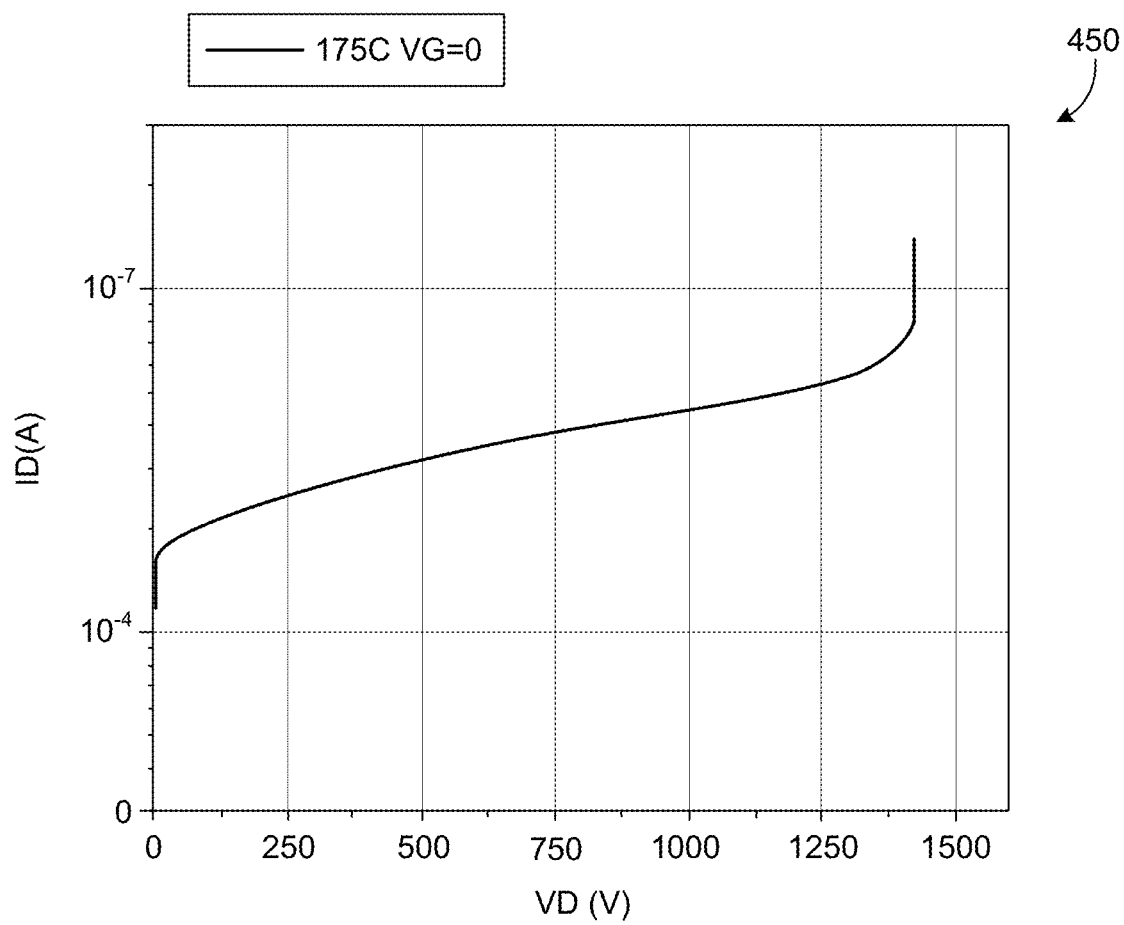
FIG. 4B is a diagram illustrating simulated voltage blocking characteristics of a SiC FET, according to an implementation.

FIG. 4A is a diagram 400 illustrating simulated output on-state characteristics of a SiC FET, according to an implementation, while FIG. 4B is a diagram 450 illustrating simulated voltage blocking characteristics of a SiC FET, according to an implementation. The simulation results shown in FIGS. 4A and 4B are for an implementation of the SiC FET 100 of FIG. 1, where an AlN mole fraction of the p-type AlGaN layer 132 is thirty percent, and a threshold voltage, Vt, of the SiC FET is greater than 1 V.

The diagram 400 of FIG. 4A illustrates output characteristics of the example SiC FET, with a drain current plotted as a function of the gate bias (VG) at a constant drain bias (VD) of 1 V (with the dashed line), and the drain current is plotted as a function of VD at a constant VG=2.3 V (with the solid line). From the results shown in FIG. 4A, it can be determined that the simulated SiC FET device (e.g., the SiC FET 100) has an $R_{spon}$ of 1.8 mOhm cm². As shown by FIG. 4B, the simulated SiC FET also has a blocking voltage that is sufficient for a 1200 V rating, with adequate margin, and also exhibits low (tens of nanoamps) of reverse (leakage) current at a temperature of 175 Celsius.

Figure 5:
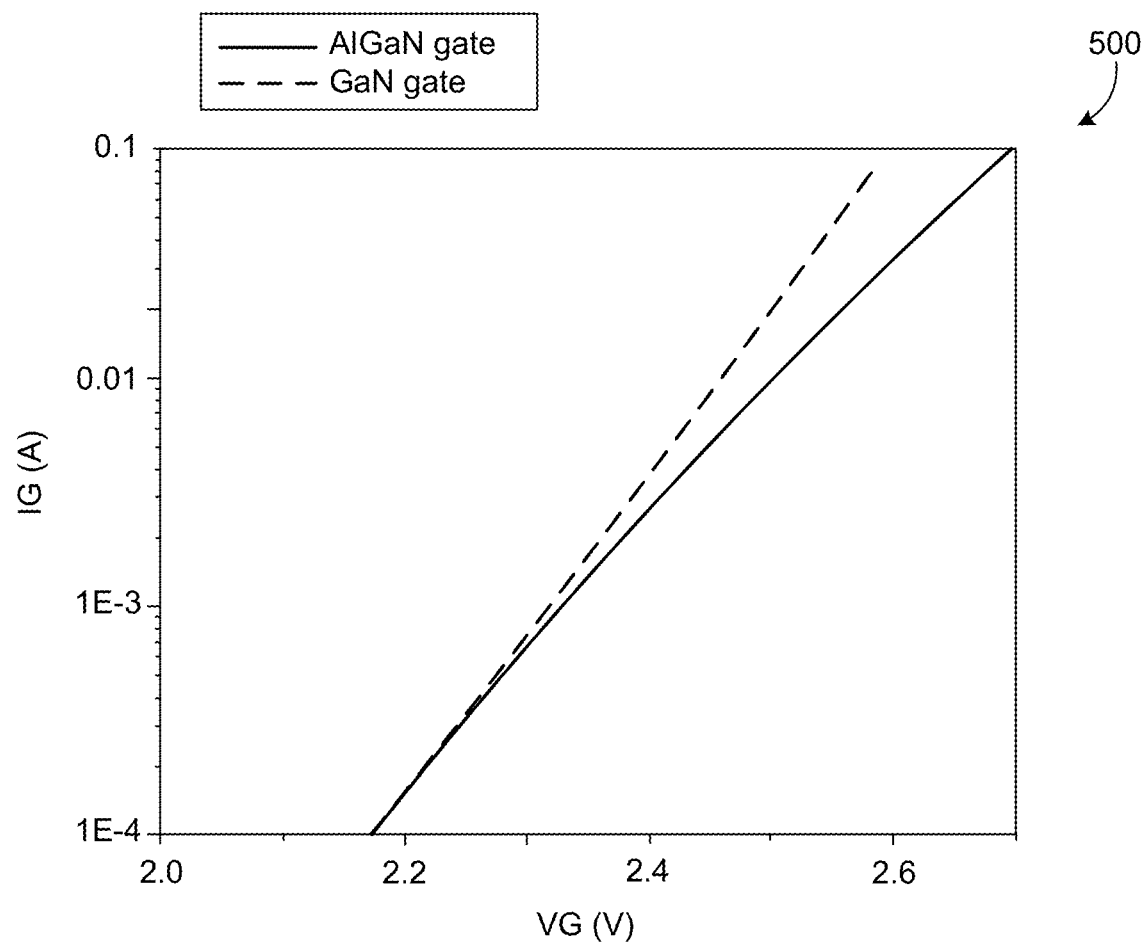
FIG. 5 is a diagram illustrating simulated gate current characteristics for SiC FET devices, according to implementations.

FIGS. 5 through 8 illustrate various simulation result for SiC FET implementations, including characteristics and comparisons of different composite gate structures. As discussed below, the simulation results of FIGS. 5 to 8 demonstrate at least some of the benefits of forming a heterojunction between a composite gate structure and a lateral channel region (e.g., of the SiC FET 100) using a p-type AlGaN layer (e.g., the AlGaN layer) 132 in combination with an AlN interface layer (e.g., the AlN layer 131). For instance, FIG. 5 is a diagram 500 illustrating simulated gate current characteristics for two SiC FET devices, one with a p-type AlGaN gate layer used to form a heterojunction with an n-type lateral channel layer, and another with a p-type GaN gate layer used to form a heterojunction with an n-type lateral channel layer. The comparison of FIG. 5 illustrates that gate leakage current of SiC FET devices, such as those described herein, can be dependent on an exact structure of the composite gate structure (e.g., a p-type gate stack).

With reference to FIG. 5, because a bandgap of AlGaN increases with the percentage of AlN in the AlGaN alloy, gate current using p-type AlGaN to form the heterojunction can improve gate leakage current in a SiC FET, as compared to using p-type GaN to form the heterojunction. For instance, a p-type gate layer with higher AlN mole fraction percentages ($X_{AlN}$) will have a higher contact potential to SiC and, as a result, lower leakage than p-type GaN, such as is demonstrated in FIG. 5. In this example, the simulation results of FIG. 5 compare a p-type AlGaN layer 132 having a 30% mole fraction of AlN, to a p-GaN in place the AlGaN layer 132 in the FET 100. As shown in FIG. 5, the p-AlGaN layer with $X_{AlN}$=0.3 has higher gate voltages for gate current turn-on than the p-GaN layer. In this example, the simulated SiC FET device had an active area of 0.057 cm$^{-2}$ and a unit cell width of 5 μm.

Figure 6:
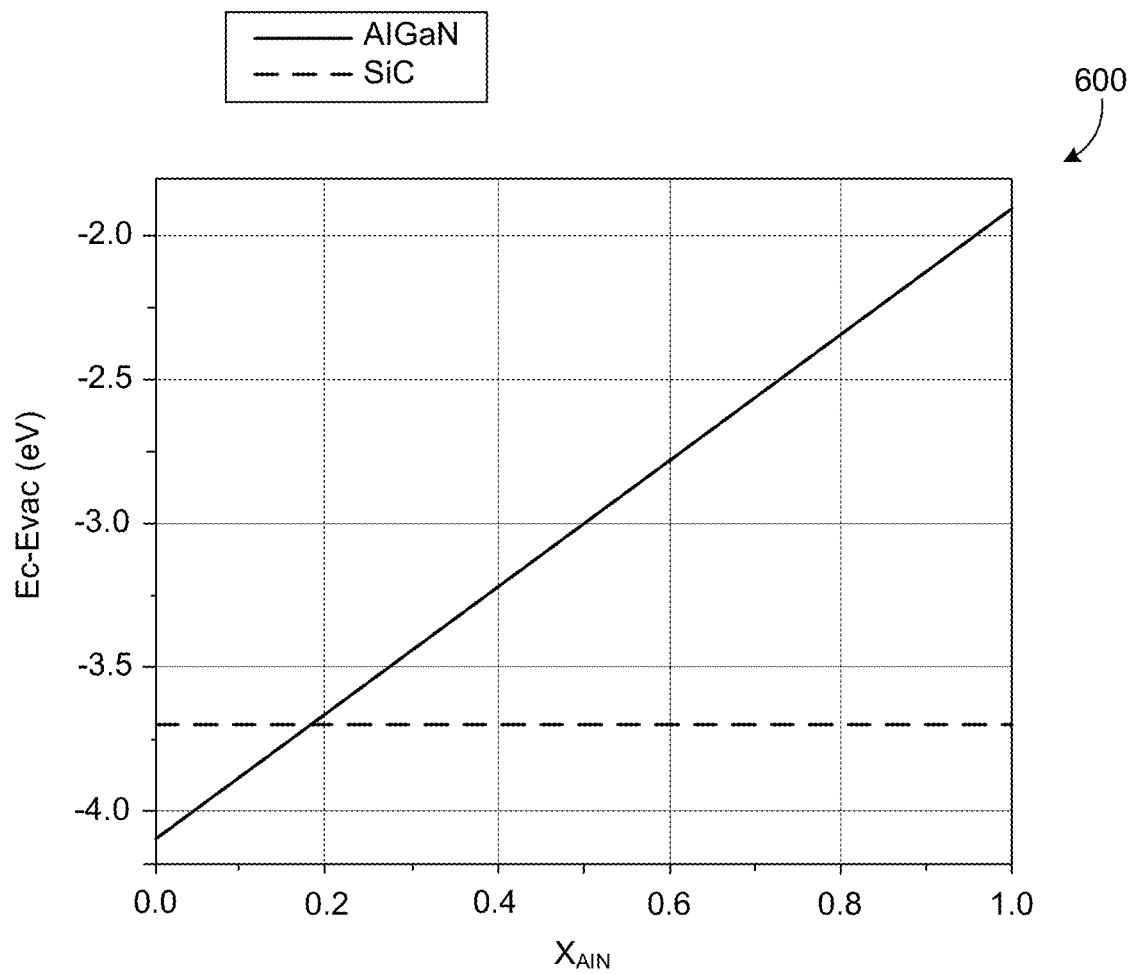
FIG. 6 is a diagram illustrating dependence of a conduction band edge of intrinsic SiC and aluminum gallium nitride (AlGaN) on a fraction of aluminum nitride (AlN) in AlGaN, according to an implementation.

FIG. 6 is a diagram 600 illustrating dependence of a conduction band edge of intrinsic SiC and AlGaN on a mole fraction of AlN in AlGaN, according to an implementation. As shown in FIG. 6, a conduction band for AlGaN can be aligned (e.g., to SiC) by adjusting an AlN mole fraction in the AlGaN layer 132 of, e.g., the FET 100. Specifically, the diagram 600 of FIG. 6 illustrates alignment of conduction bands with respect to the vacuum level Evac as a function of AlN mole fraction, $X_{AlN}$. As illustrated by the diagram 600, a conduction band edge of AlGaN remains below a conduction band edge of SiC until an $X_{AlN}$ mole fraction of approximately 18%. That is, for $X_{AlN}$<0.18, the heterojunction of the p-type AlGaN and SiC has a Type II nature, e.g., the conduction band position decreases with increasing the bandgap energy. Such a heterojunction is not as an efficient injector as a Type I heterojunction, for which the increase of the bandgap is also accompanied by the increase of $E_C$. As shown in FIG. 6, such Type I behavior can be realized with $X_{AlN}$ mole fractions of greater than 18%.

Figure 7:
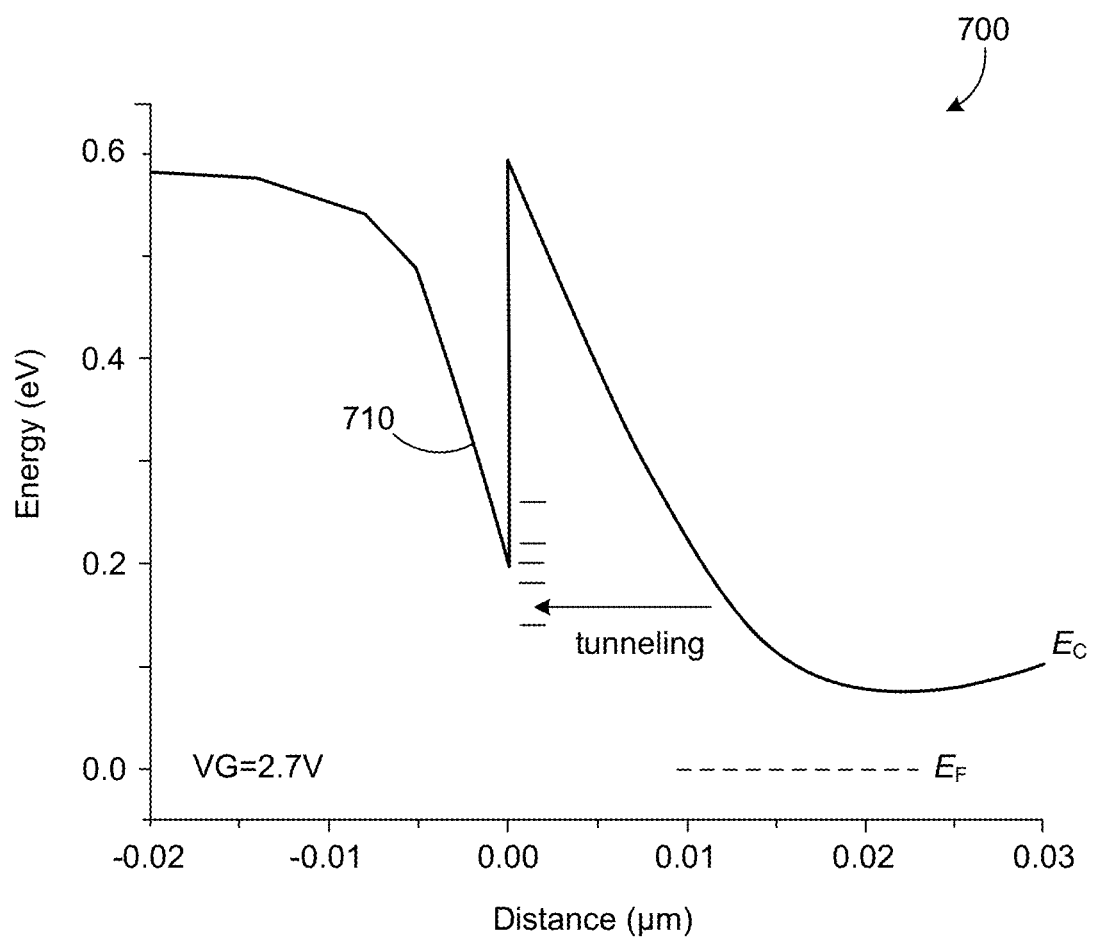
FIG. 7 is a diagram illustrating a simulated band diagram of a forward-biased p-type gallium nitride (GaN) gate, according to an implementation.

In comparison with the conduction band diagram for a p-type AlGaN heterojunction gate structure illustrated in FIG. 3, FIG. 7 illustrates a band diagram 700 in the vicinity of forward-biased p-type GaN heterojunction gate structure simulated for a gate voltage VG=2.7 V. As shown in FIG. 7, a potential pocket 710 resulting from the type-II heterojunction between p-type GaN and SiC can cause excessively high forward gate current, particularly if an interface between SiC (e.g., the lateral channel region 105) to the p-type GaN layer has a high density of interface states. Such an undesired excessive current can then flow as a result of electron tunneling to the SiC-to-GaN interface, such as is shown in the diagram 700 shown in FIG. 7.

Also, as can be seen from FIG. 7 (and FIG. 8) the Type II heterojunction between p-type GaN and SiC (e.g., the lateral channel region 105) has a conduction band discontinuity that is an opposite sign to the bandgap discontinuity at the GaN to SiC interface. This conduction band discontinuity is undesirable in SiC FETs where achieving a low forward current in forward bias is intended. As described here, this disadvantage can be overcome using p-type AlGaN.

Furthermore, a defect density ($D_{it}$) at the SiC (lateral channel region 105) and gate structure interface (whether using p-type GaN or p-type AlGaN to form the heterojunction) can also contribute to gate leakage current of SiC FET implementations. Even though the discontinuity of a conduction band of AlGaN (as shown in FIG. 6) becomes positive for a AlN mole fractions in AlGaN of greater than 0.18, it is, however, beneficial to have at least a few monolayers of pure AlN at the interface to SiC (e.g., the interface between the AlGaN layer 132 and the lateral channel region 105) due to better interface matching of AlN to SiC, resulting in a lower interface state density.

For instance, referring again to FIG. 1, the AlN layer 131 (disposed between the SiC (lateral channel region 105) and the AlGaN layer 132 (or a GaN layer) can reduce $D_{it}$ as compared to directly disposing the AlGaN layer 132 on SiC. For example, a few monolayers to 30 nm of AlN, such as discussed above with respect to FIG. 1, can achieve a $D_{it}$ of less than $1\times10^{11}$ cm$^{-2}$eV$^{-1}$. While an AlN layer 131 of a few monolayers thickness may not be able to block gate current, its presence at the interface between the AlGaN layer 132 and the lateral channel region 105 (e.g., in implementations of the FET 100) will decrease the interface state density $D_{it}$ at the heterojunction between the n-type SiC of the lateral channel region 105 and the AlGaN layer 132 of the composite gate structure and, as a result, reduce gate leakage current.

Figure 8:
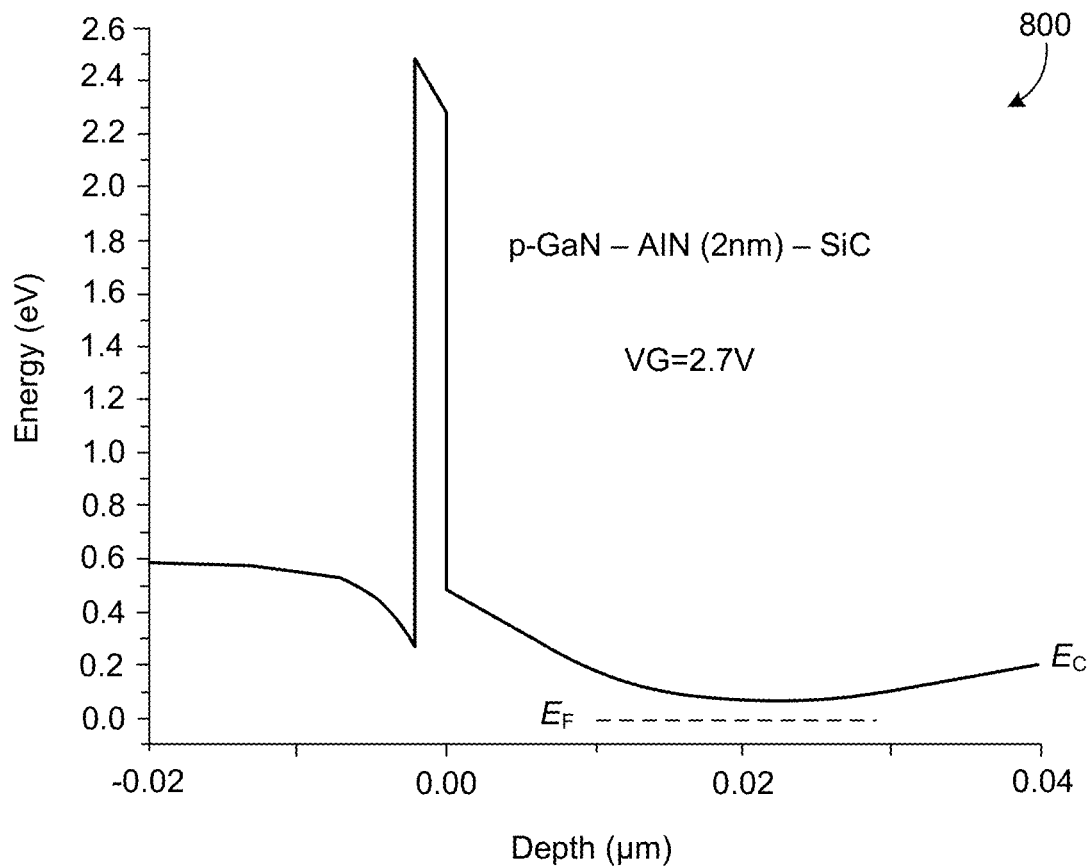
FIG. 8 is a diagram illustrating a conduction band of an n-type SiC—AlN-p-type GaN heterostructure at a positive gate bias, according to an implementation.

FIG. 8 is a diagram 800 illustrating a conduction band of for a SiC JFET having an-type SiC—AlN-p-type GaN heterostructure at a positive gate bias of 2.7 V, according to an implementation. The diagram 800, as compared to the diagram 700 in FIG. 7, while shown for a heterojunction formed using p-type GaN, illustrates the benefit of an AlN layer as an interface layer between SiC and a composite gate structure (e.g., for heterojunctions formed using GaN or AlGaN). That is, the conduction band diagram 800 of FIG. 8 illustrates simulation results for a forward-biased p-type GaN layer with n-type SiC (e.g., a lateral channel region 104) and an AlN interface layer having a thickness of 2 nm. As is shown by a comparison of the diagram 800 of FIG. 8 with the diagram 700 of FIG. 7 (e.g., corresponding with a p-type GaN to n-type SiC heterojunction, with no AlN interface layer), it can be seen that the 2 nm AlN layer significantly suppresses both interface trapping and tunneling. A similar benefit is realized for AlN interface layers between AlGaN and SiC, such as in the FETs described herein.

While interface state density at the interface of AlN to GaN or AlGaN can be a low number, such as discussed above, when a thin (e.g., 1 to 30 nm) layer of AlN is used to implement an interface layer 131, such as in FIG. 1, excessively thick layers of AlN for the interface layer 131 could result in formation of a dense network of dislocations, and a corresponding increase in density of interface traps (e.g., an increase in $D_{it}$) as a result. Depending on the particular implementation (e.g., semiconductor process) the thickness of the AlN interface layer 131 may vary between approximately 10 nm and 40 nm. In other implementations, the AlN interface layer can have a thickness of less than 10 nm, or a thickness of greater than 40 nm.

Figure 9A:
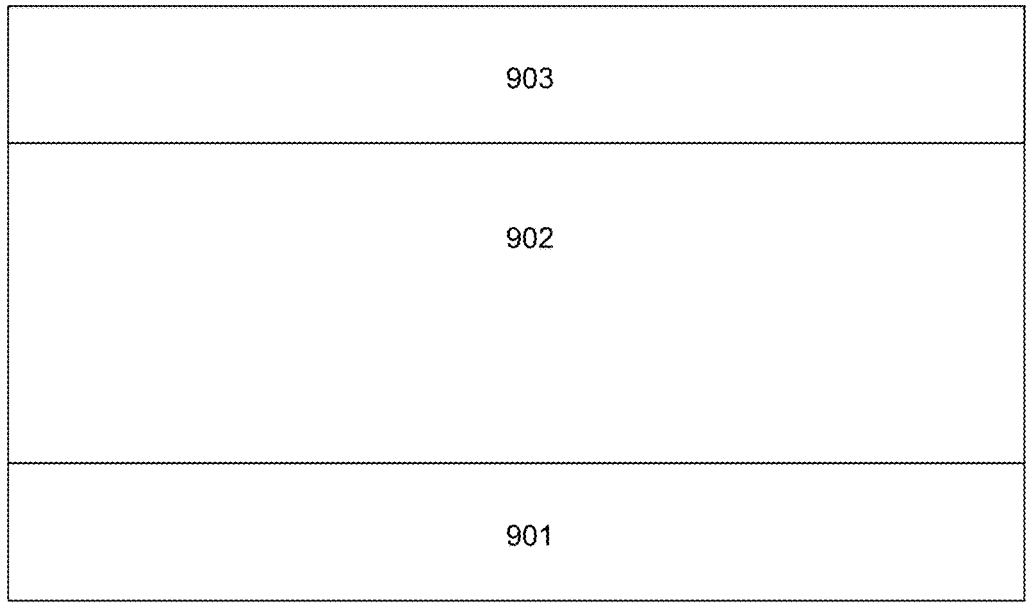
FIGS. 9A though 9K are diagrams illustrating side cross-section views show for a fabrication process of a SiC field-effect transistor (FET), according to an implementation.

FIGS. 9A though 9K are diagrams illustrating side cross-section views of a semiconductor device fabrication process for producing a SiC FET, according to an implementation. In some implementations, the process illustrated in FIGS. 9A-9K, or a similar process, can be used to produce the SiC FETs described herein, such as, for example, the FET 100 of FIG. 1 and/or the MOSFET 1400 of FIG. 14. In other implementations, other process flows can be used to produce the FETs described herein.

The process of FIGS. 9A through 9K ("process") includes, as shown in FIG. 9A, depositing an epitaxial layer (e.g., of a low-doped n-type SiC carbide material) to form a drift region layer 902 on a substrate 901. In some implementations, the substrate 901 can be heavily doped, hexagonal, n-type SiC, such as SiC of a 4H polytype modification. A doping concentration and thickness of the drift region layer 902 can be selected, e.g., based on a desired operating voltage (e.g., blocking voltage, voltage rating, etc.) of a corresponding FET produced by the process. For example, in some implementations, for a FET with a 1200V operating (blocking) voltage, a doping (donor doping) concentration of the drift region layer can be in a range of approximately $8\times10^{15}$ cm$^{-3}$ to $1.3\times10^{16}$ cm$^{-3}$, and the thickness can be in a range of approximately 8 to 12 microns.

As also shown in FIG. 9A, an upper portion of the epitaxial layer including the drift region layer 902 can have a higher donor (doping) concentration, so as to form (define, etc.) an n-type spreading layer 903 (e.g. a vertical JFET channel region). A doping of the spreading layer 903 can be in a range of approximately 1.5× to 5× the doping concentration of the drift region layer 902 doping, where the selected doping concentration of the spreading layer 903 can depend on a desired width of the vertical JFET channel. In some implementations, additional (increased) n-type doping in the spreading region 903 (as compared to the drift region layer 902) can be achieved by increasing a flow rate of an n-type dopant during a corresponding epitaxial deposition process. In some implementations, additional (increased) n-type doping in the spreading region 903 (as compared to the drift region layer 902) can be achieved using a blanket implantation of donor atoms such as nitrogen, phosphorus, arsenic or antimony into an upper portion of the epitaxial layer that includes the drift region layer 902.

It is noted that the example numbers for thickness and doping concentration of the drift region layer 902 given above are example values for a FET device (e.g., FET 100) with a blocking voltage of 1200 V. In some implementations, if a FET device with a lower or higher blocking voltage is to be produced, values of the drift region doping concentration and thickness can be adjusted to support (block) an associated peak electric field in an off-state of the FET device, e.g., within the limits of electrical strength of 4H silicon carbide.

Figure 9B:
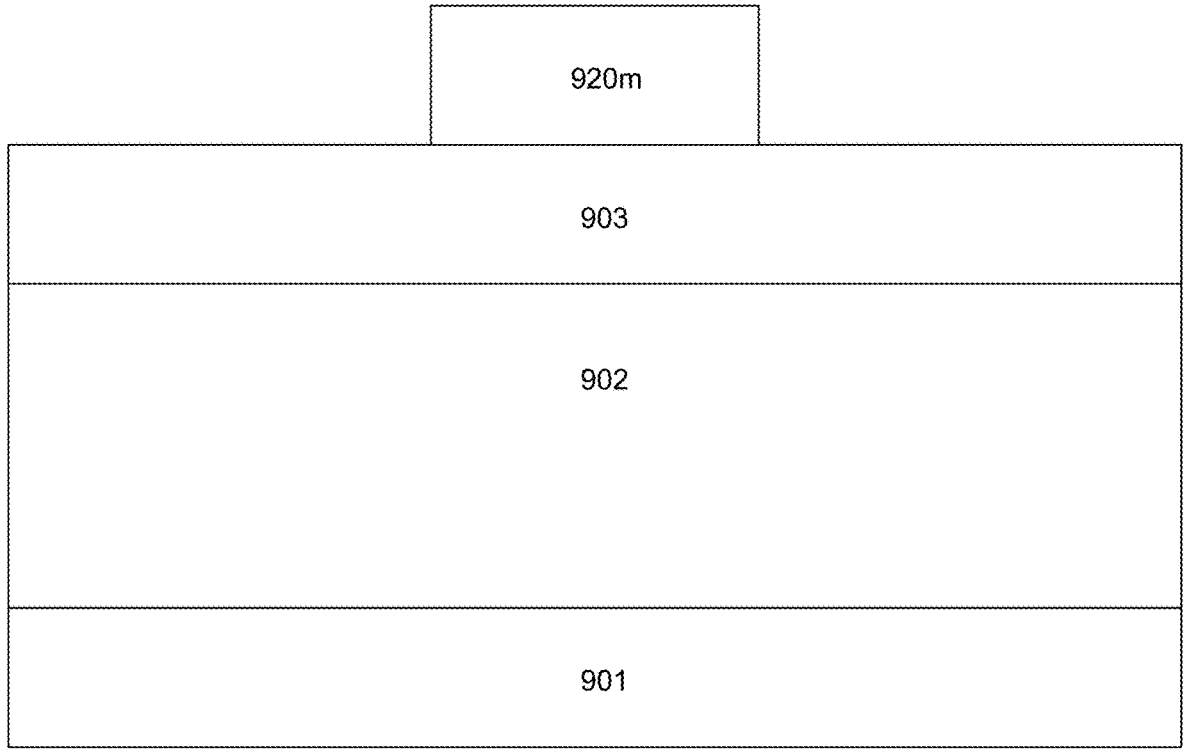
Figure 9C:
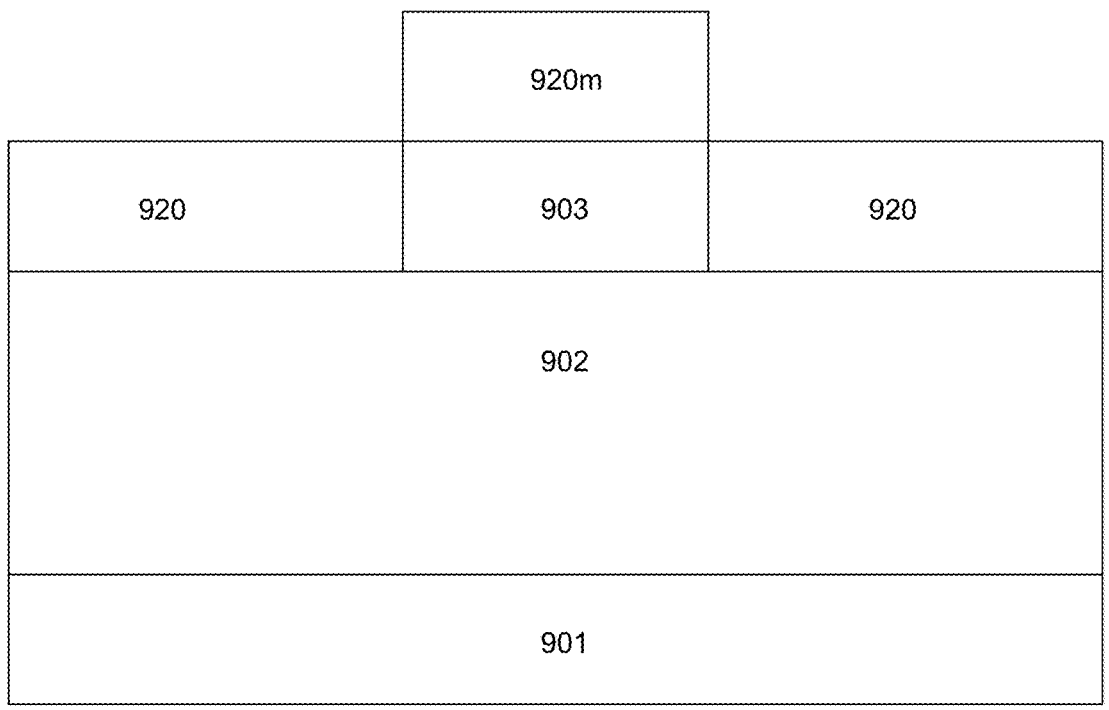

As shown in the FIG. 9B, the process can include forming and patterning an implant mask 920m. The implant mask 920m, as shown in FIG. 9C, can be used as an implant blocking mask for formation of (defining, etc.) p-type body regions 920. In some implementations, the implant mask 920m can be formed from silicon dioxide and, after formation of the implant mask 920m, acceptor ions can be implanted to form the p-type body regions 920.

Figure 9D:
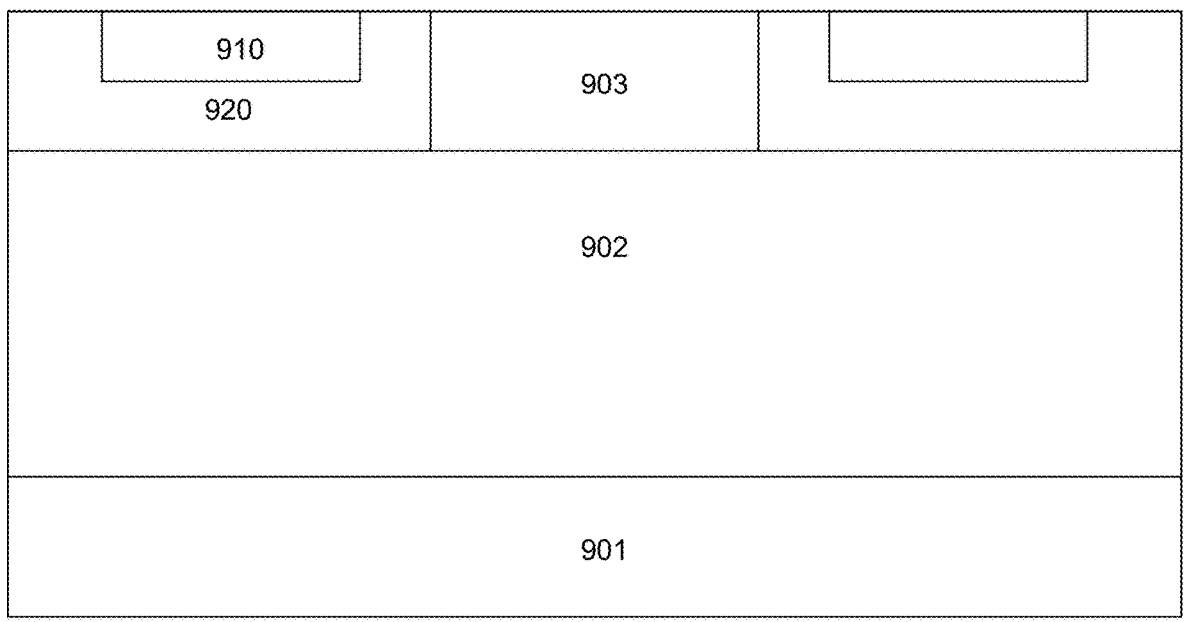

Referring to FIG. 9D, after formation of the p-type body regions 920, the mask 920m can be removed. A new implant mask (not shown) can then be formed, and used to define the n-type source regions 910. That is, as shown in FIG. 9D, donor ions can be implanted to form the source regions 910, where an implant mask can be used to define where the source regions 910 are formed, e.g., by blocking the donor implant where the source regions 910 are not wanted). In some implementations, acceptor doping concentration in the p-type body regions 920 can be $10^{18}$ cm$^{-3}$ or higher, and donor doping concentration in the source regions 910 can be $5\times10^{18}$ cm$^{-3}$ or higher. Hot ion implantation at a substrate temperature between 200 C and 600 C can be used when forming (defining, implanting, etc.) the source regions 910 and the body regions 920, which can help prevent undesired amorphization of the SiC crystal.

Figure 9E:
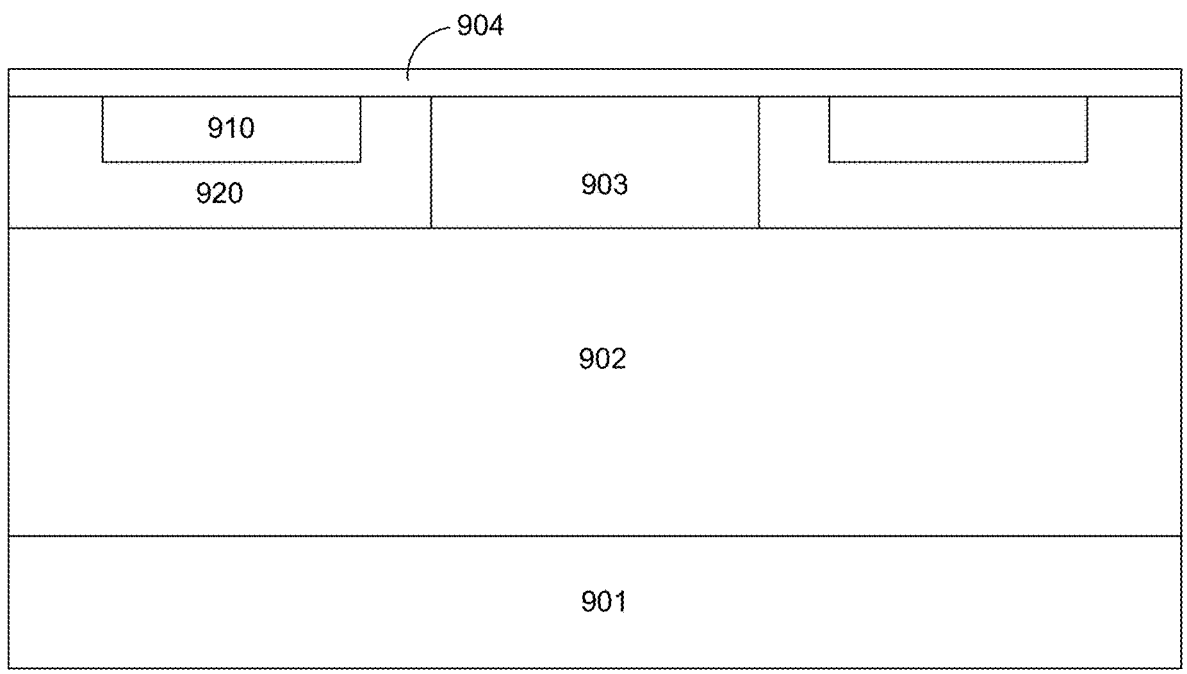
Figure 9F:
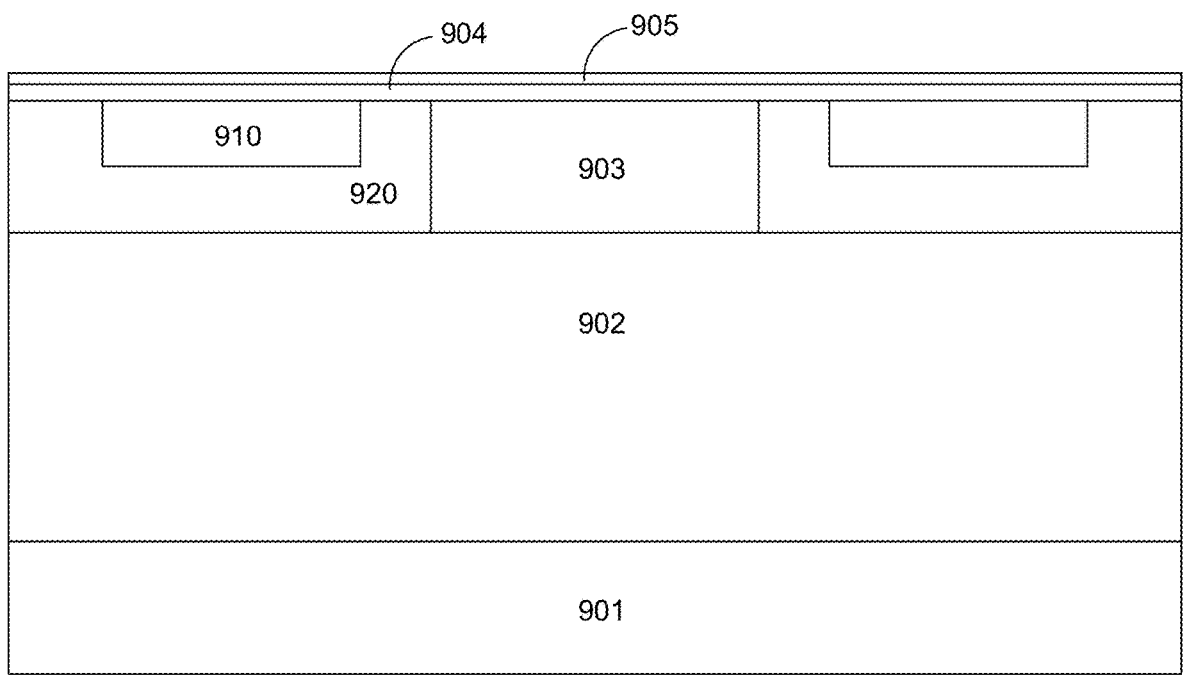

Referring to FIG. 9E, the implant mask used for defining the source region 910 can be removed, e.g., by etching, and an n-type spacer layer 904 can be formed using epitaxial SiC regrowth. In some implementations (such as the example 1200 V rated FET), the spacer layer 904 can have a thickness of between approximately 80 nm and 300 nm. Subcontact p-type region 921 can then be formed using hot Al ion implantation with a doping concentration of $2\times10^{19}$ cm$^{-3}$ or higher. As illustrated in FIG. 9F a blanket donor implantation can be performed to define a lateral channel region 905 in an upper portion of the space layer 904, such as having the characteristics of a lateral channel region described herein.

Figure 9G:
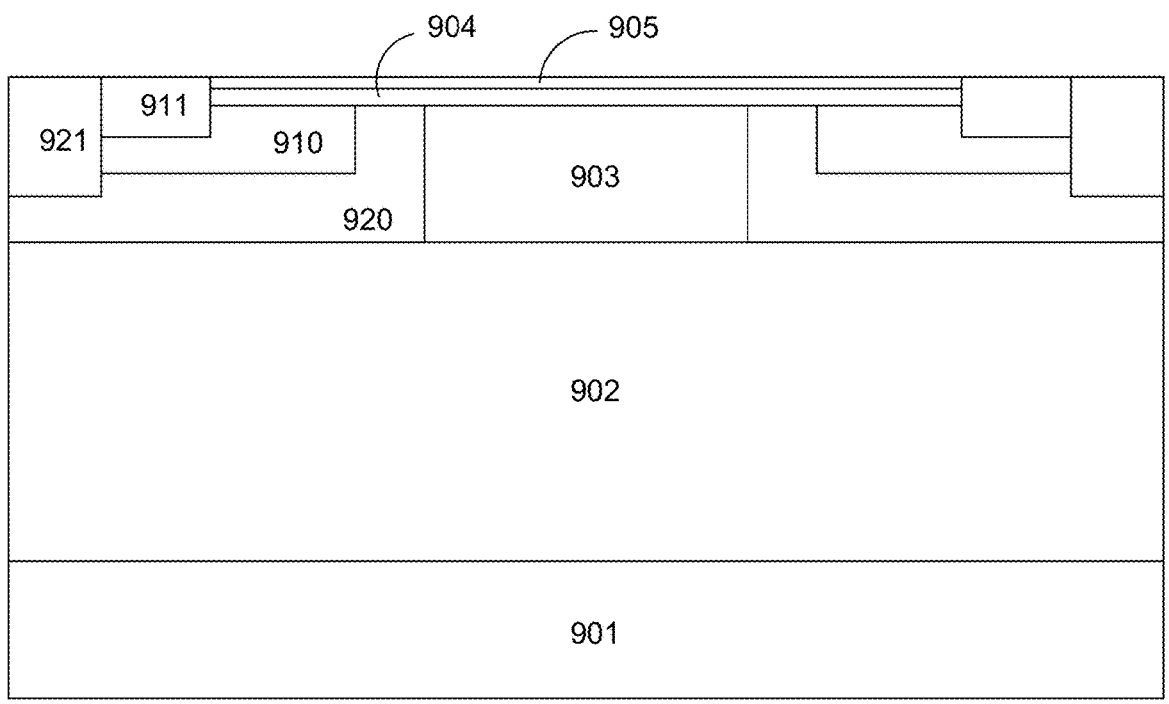

As shown in FIG. 9G, n-type source subcontact regions 911 and p-type body subcontact regions 921 (e.g., using one or more implant masks) can then be implanted (defined, formed, etc.). While not shown in FIGS. 9A-9K, junction termination regions around a periphery of a corresponding FET device can also be implanted when forming the subcontact regions 911 and/or 921.

In the process of FIGS. 9A-9K, after forming the subcontact regions 911 and 921, a post-implantation anneal can be performed at a temperature between approximately 1500 C and 1900 C to activate the implanted dopants (e.g., of the lateral channel 105, the source regions 910, the body regions 920, the subcontact regions 911 and 921, and/or the termination regions). In some implementations, such an anneal process can be performed using a carbon coating on the top side of the SiC wafer, which can avoid roughening of the upper surface of the SiC during the anneal.

Figure 9H:
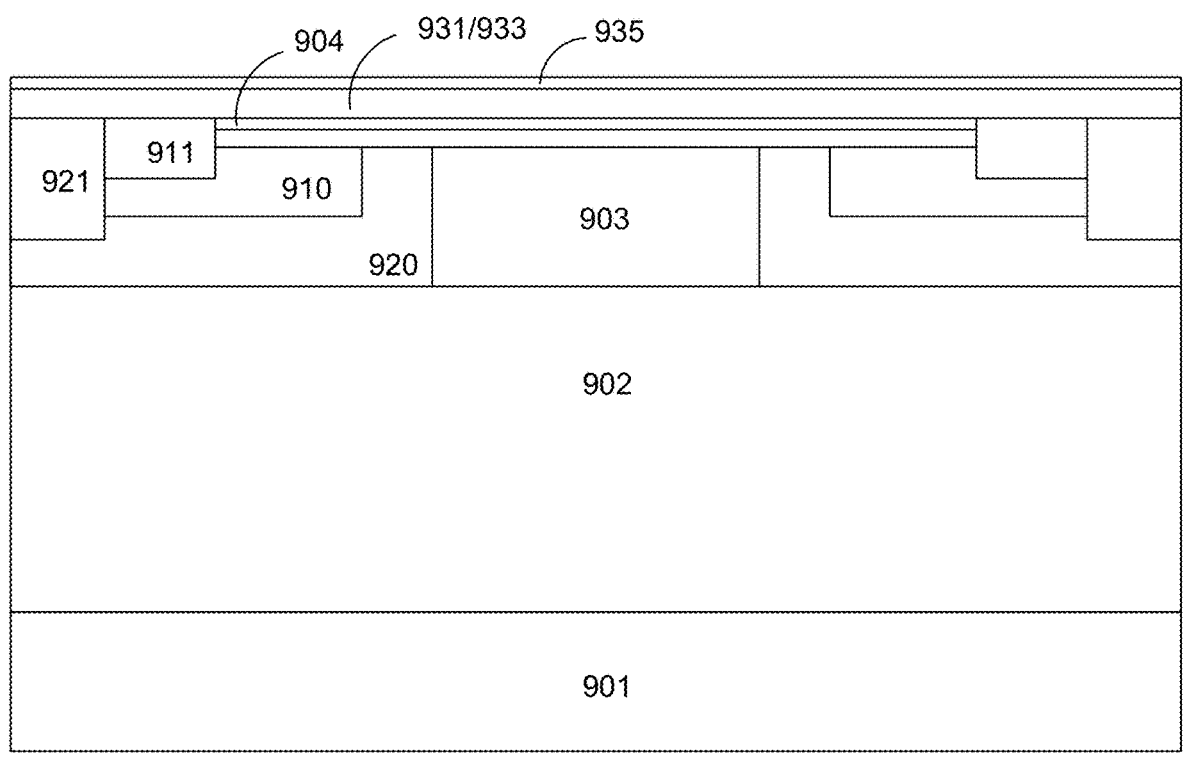

After removal of the associated carbon layer of the implant activation anneal process, a sacrificial oxidation of SiC can be performed, which can include forming at least a few nanometers of sacrificial silicon dioxide. The sacrificial silicon dioxide can then be removed (which can reduce a number of surface defects caused by previous processing operations), and a gate stack including an AlN layer, an AlGaN layer and a GaN layer can be deposited. In FIG. 9H, the AlN, AlGaN and GaN gate stack is shown as a single composite gate stack 931/933. In some implementations, the layers of the composite gate stack 931/933 shown in FIG. 9H can be deposited using chemical-vapor deposition (CVD), Molecular Beam Epitaxy (MBE), and/or plasma-enhanced CVD. In some implementations, magnesium dopant can be provided during formation of the composite gate stack, e.g., to ensure p-type conductivity of the AlGaN and GaN layers. In some implementations, a doping concentration of the AlGaN and GaN layers of the composite gate stack 931/933 can be $1 \times 10^{19}$ cm$^{-3}$, or higher. An anneal in nitrogen gas, or in a nitrogen-oxygen mixture can then be performed, e.g., so as to activate Mg dopant in the composite gate 931/933.

Figure 9I:
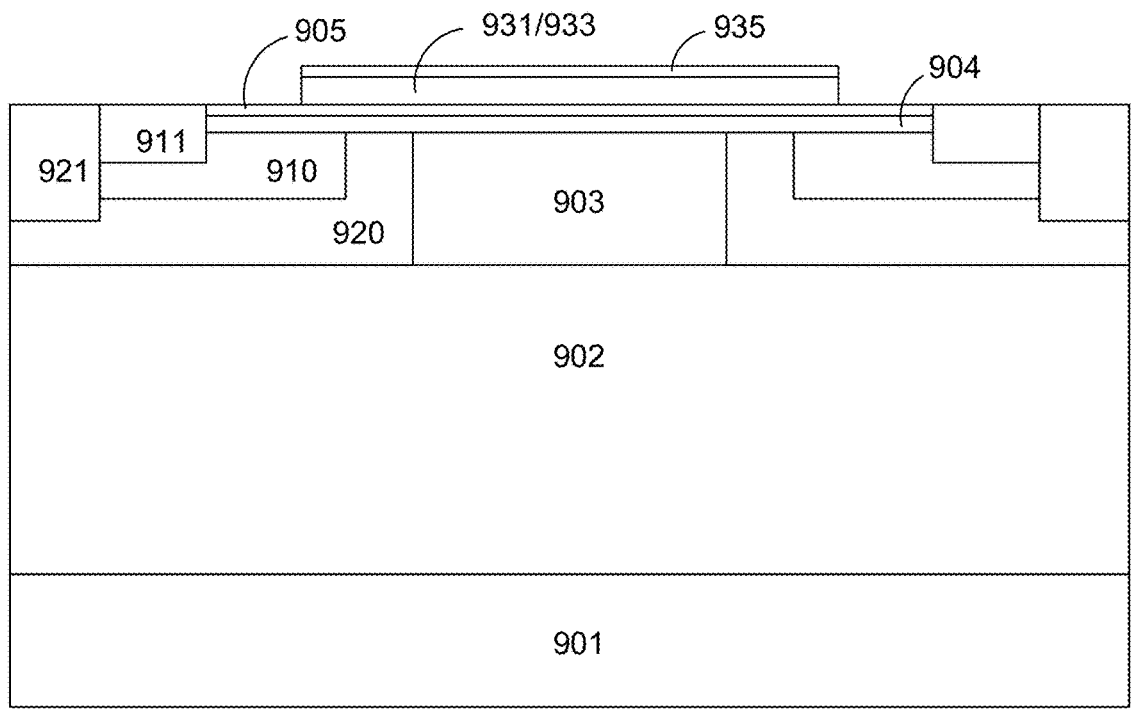

As further shown in FIGS. 9H and 9I, a gate metal layer 935 can be deposited and patterned onto the composite gate stack 931/933, In some implementations, the gate metal layer 935 can include titanium nitride (TiN) or tantalum nitride (TaN).

As also shown in FIG. 9I, the composite gate stack 931/933 and the gate metal layer 935 can then be etched (e.g., dry etched) to define the gate stack structure shown in FIG. 9I, and also to expose the SiC surface (e.g., for formation of contacts to the source regions 910 and the body regions 920).

Figure 9J:
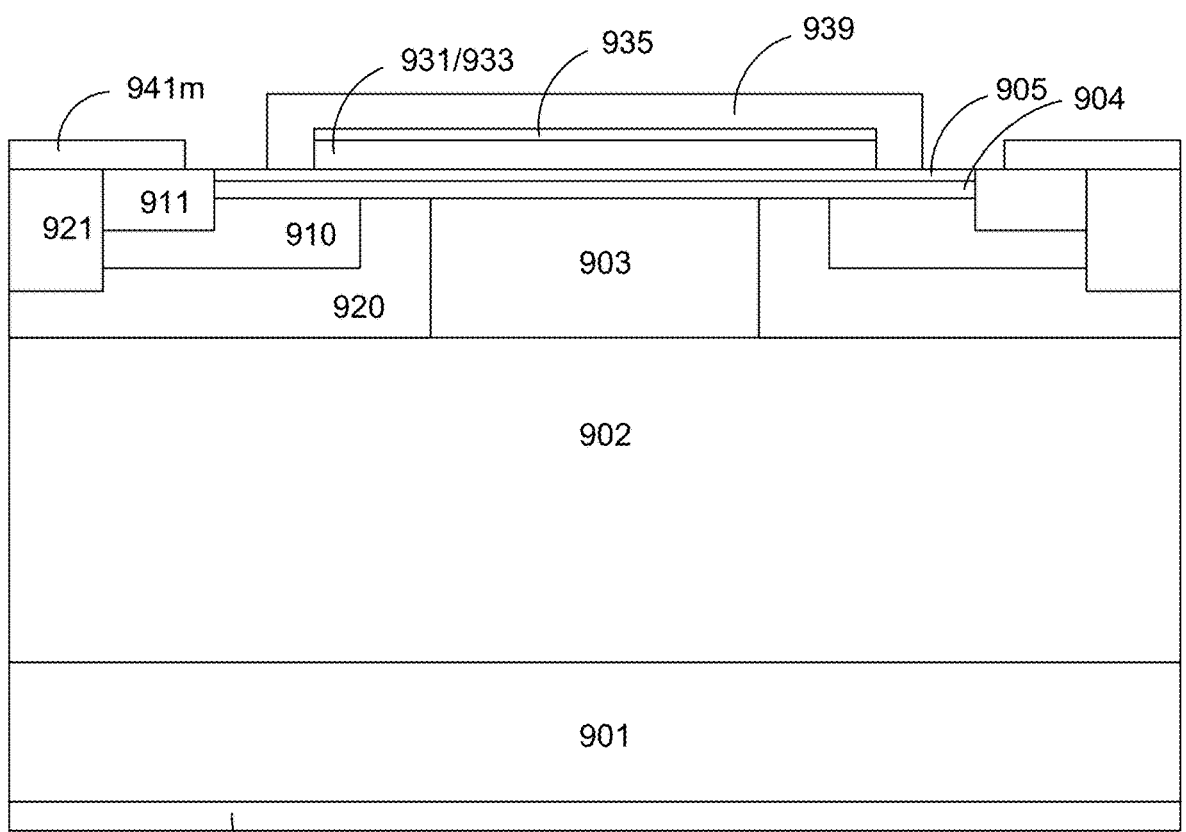
Figure 9K:
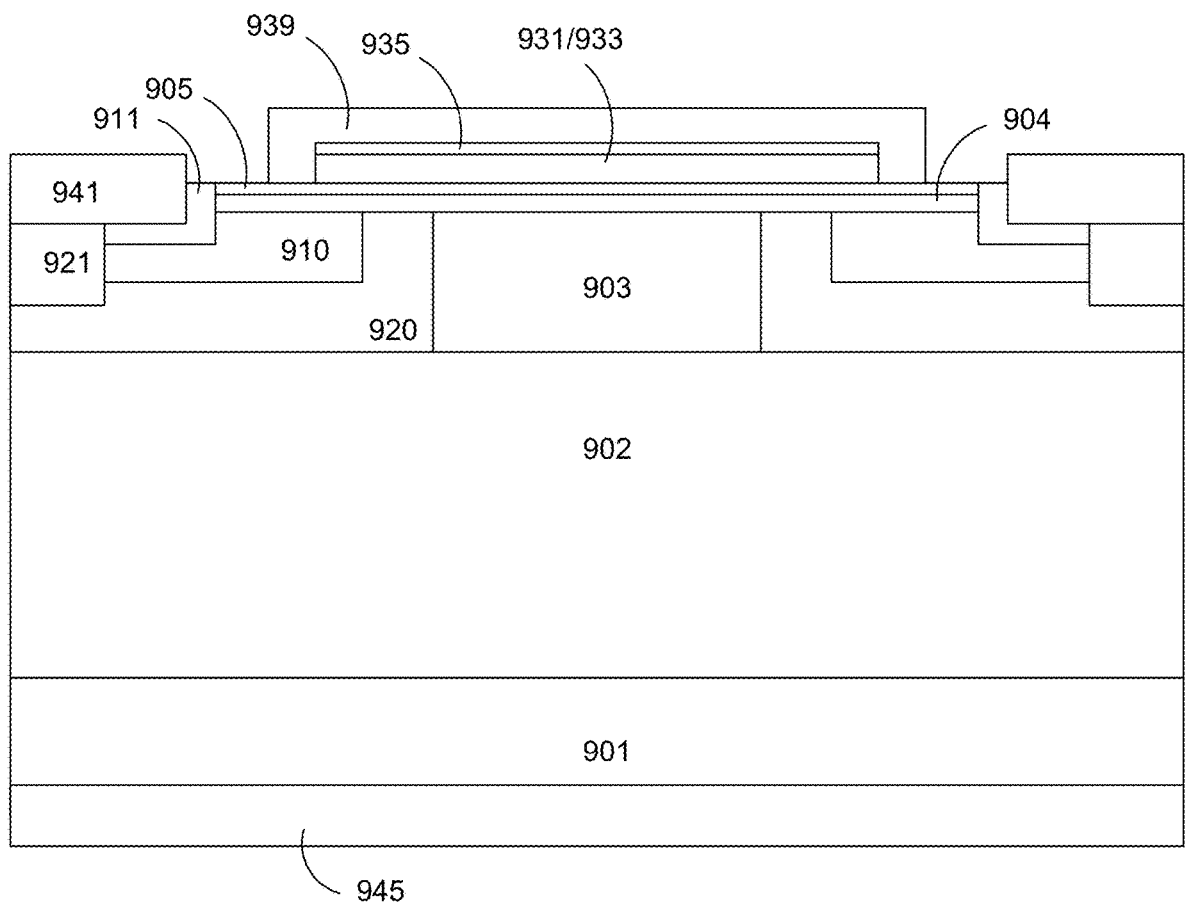

As shown in FIG. 9J, an interlayer dielectric 939 can then deposited and patterned over the gate stack. In some implementations, the interlayer dielectric 939 can include silicon nitride, silicon dioxide, or a stack of silicon nitride and silicon dioxide. As further shown in FIG. 9J, a metal 941*m* (e.g., nickel) that can be used to form Ohmic contacts to SiC can then be deposited and patterned. Further, as illustrated in FIG. 9J, a metal layer 945*m* (e.g., nickel) can be also deposited onto a backside of an associated SiC wafer, where the metal layer 945*m* can be used for defining (forming, producing, etc.) a backside Ohmic contact. An anneal can then be performed to form a silicide (e.g., nickel silicide from the metal layers 941*m* and 945*m*, and the SiC), and to produce (define, etc.) Ohmic contacts 941 and 945, as shown in FIG. 9K. In this example, the resulting nickel silicide can penetrate into the silicon carbide during the anneal (e.g., silicide reaction). In some implementations, formation of nickel silicide can allow for omitting the formation the subcontact regions 911 and 921. For instance, in certain implementations, because, during silicide formation, reacting nickel (with SiC) can penetrate through an entire depth of the later channel region 905 and the spacer layer 904, formation of subcontact regions 911 and 921 for defining Ohmic contacts can be eliminated.

While not shown in FIG. 9K, in the example process, a topside pad metal can then deposited and patterned, and a backside metal can also deposited, e.g., such as in the FET 100 of FIG. 1. In some implementations, such a topside metal may include aluminum, and the backside metal may include a stack of titanium, nickel and silver, though other metals can be used. After formation of the topside pad metal, a passivation dielectric, such as silicon nitride, silicon dioxide and/or polyimide can be formed in a peripheral region(s) of the FET 900. Gate pad regions, which are not shown in FIGS. 1 and 9A-9K, can be formed simultaneously with source pads (such as the source pad metal 148 shown in FIG. 1).

In some implementations the gate contact (e.g., between the gate metal layer 935 and the gate stack 931/933) can be formed without using an annealing process, which can reduce gate leakage under forward gate bias conditions. The topside contacts to silicon carbide may, in this example, also be formed without annealing, and formed as ohmic-as-deposited contacts using the subcontact regions 911 and 921. In this example implementation, respective doping concentrations of the subcontact regions 911 and 921 can be increased to a value above $1 \times 10^{20}$ cm$^{-3}$, so as to facilitate (produce, result in, etc.) the contacts having Ohmic-as-deposited contact properties.

Figure 10:
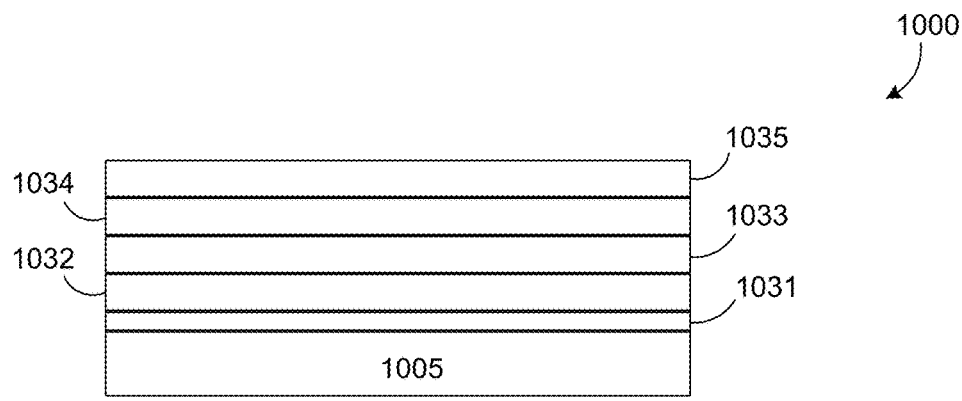
FIG. 10 shows the structure of the gate stack having a tunnel GaN diode according to an implementation.

FIG. 10 shows a gate structure stack 1000 of a SiC JFET, where the gate structure stack 1000 includes a GaN tunnel diode, according to an implementation. In some implementations, the gate structure stack of FIG. 10 can be implemented in the SiC FET 100 of FIG. 1, e.g., in place of the gate structure stack discussed above with respect to FIG. 1. In FIG. 10, only a portion of a lateral channel region 1005 of the underlying SiC FET structure is shown, for purposes of illustration. The gate structure stack 1000 includes an AlN interface layer 1031 disposed on the lateral channel region 1005, a p-type AlGaN layer 1032, a p-type GaN layer 1033, and n-type GaN layer 1034. The GaN layers 1033 and 1034 are heavily doped, respectively, with acceptor ions and donor ions, such that a tunnel diode is defined between the layers 1033 and 1034.

In this example implementation, gate leakage can be controlled by controlling respective doping concentrations of the p-type GaN layer 1033 and the n-type GaN layer 1034. The gate structure stack 1000 further includes a gate metal layer 1035 that is disposed on the n-type GaN layer 1034. In some implementations, the p-type GaN layer 1033 can be omitted and the n-type GaN layer 1034 can be disposed directly on the p-type AlGaN layer 1032. However, in some implementations, use of the n-type GaN layer 1034 can improve the quality (e.g., lower a resistance) of the ohmic contact between the gate metal layer 1035 and the composite gate structure, such as an ohmic contact between a gate metal layer and a p-type GaN layer.

Figure 11:
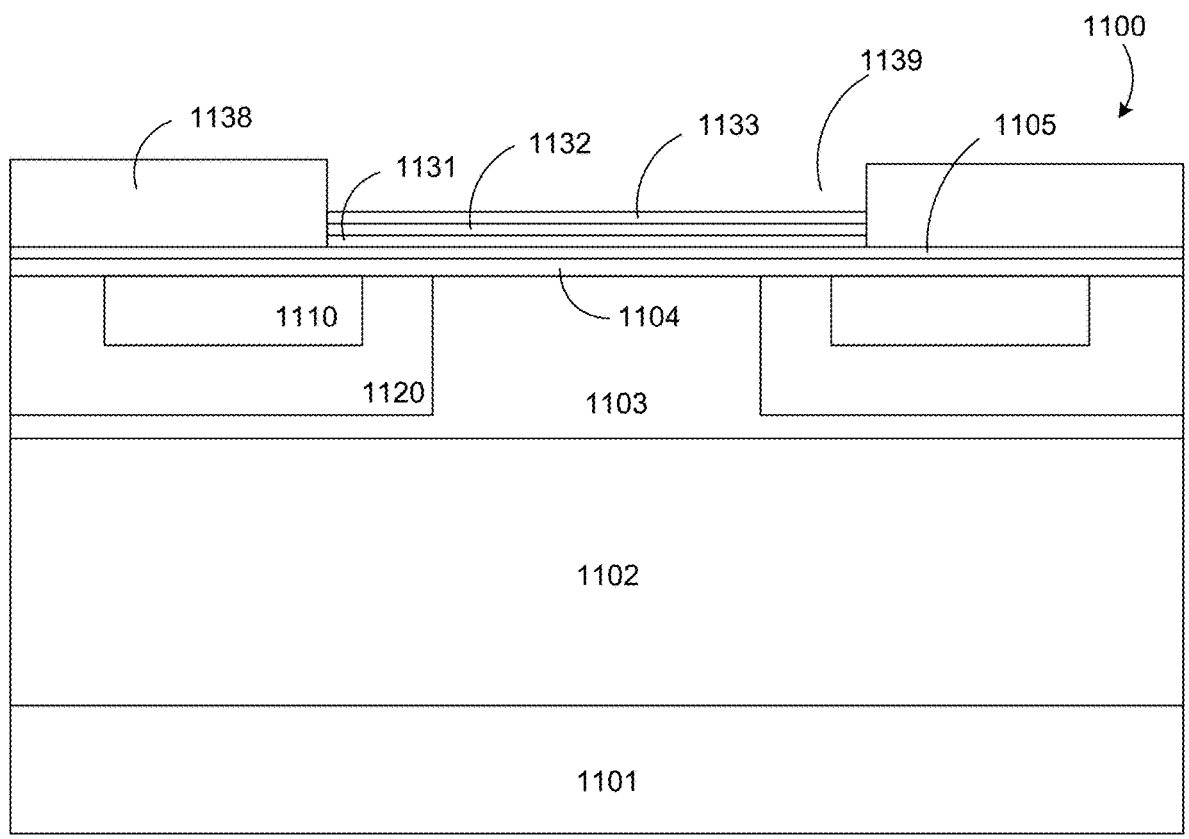
FIG. 11 shows a fabrication stage of SiC FET according to an implementation.

FIG. 11 illustrates a SiC FET 1100 that is similar in structure to the SiC FET 100 of FIG. 1, where the composite gate structure stack is disposed (e.g., using selective deposition) in a well 1139 defined in a SiO$_2$ mask 1138. For instance, the SiC FET 1100 includes a substrate 1101 of a first conductivity type, a drift region 1102 of the first conductivity type, a spreading layer 1103 of the first conductivity type, body regions 1120 of a second conductivity type, source regions 1110 of the first conductivity, a spacer layer 1104 of the first conductivity type, and a lateral channel region 1105 of the first conductivity type.

As also shown in FIG. 11, a composite gate structure stack of the SiC FET 1100 (similar to that of the composite gate structure stack of the FET 110 in FIG. 1) can be disposed within the well 1139 defined in the SiO$_2$ mask 1138. For instance, the gate structure stack of the SiC FET 1100 includes an AlN interface layer 1131 disposed on the lateral channel region 1105, a p-type AlGaN layer 1132, and a p-type GaN layer 1133. While not specifically shown in FIG. 11, the gate structure stack of the SiC FET 1100 can further include a gate metal layer that is disposed on the p-type GaN layer 1033, such as shown in other example implementations described herein. As noted above, the gate stack of the AlN layer 1131, p-type AlGaN layer 1132 and the p-type GaN layer 1133 can be selectively deposited into, or selectively grown in the well 1139. For implementations using non-selective deposition techniques, gate stack material that is deposited on the SiO$_2$ mask 1138 (e.g., outside the well 1139) can be removed by selective etching.

FIG. 12 is a diagram that schematically illustrates a plan view of a SiC FET 1200. As shown in FIG. 12, the FET 1200 can include an active region that includes a 1-dimensional array of linear unit cells 1260. In some implementations, the unit cells 1260 of the SiC FET 1200 can have the structure of the SiC FET 100 of FIG. 1, and/or can include features of a SiC FET described with respect to, e.g., FIGS. 10 and 11. That is, in some implementations, the unit cells 1260 can include and/or combine certain features of the various SiC FETs described herein.

The SiC FET 1200 of FIG. 12 can also further include a termination region 1271 that is disposed around the active region of the SiC FET 1200. Different approaches (structures) for junction termination can be included in the termination region 1271, where the particular termination structure used will depend on the implementation of the unit cells 1260 of the SiC FET 1200. In the SiC FET 1200, the termination region 1271 should have, e.g., a same or higher breakdown voltage as the active region of the array of unit cells 1260.

Figure 13:
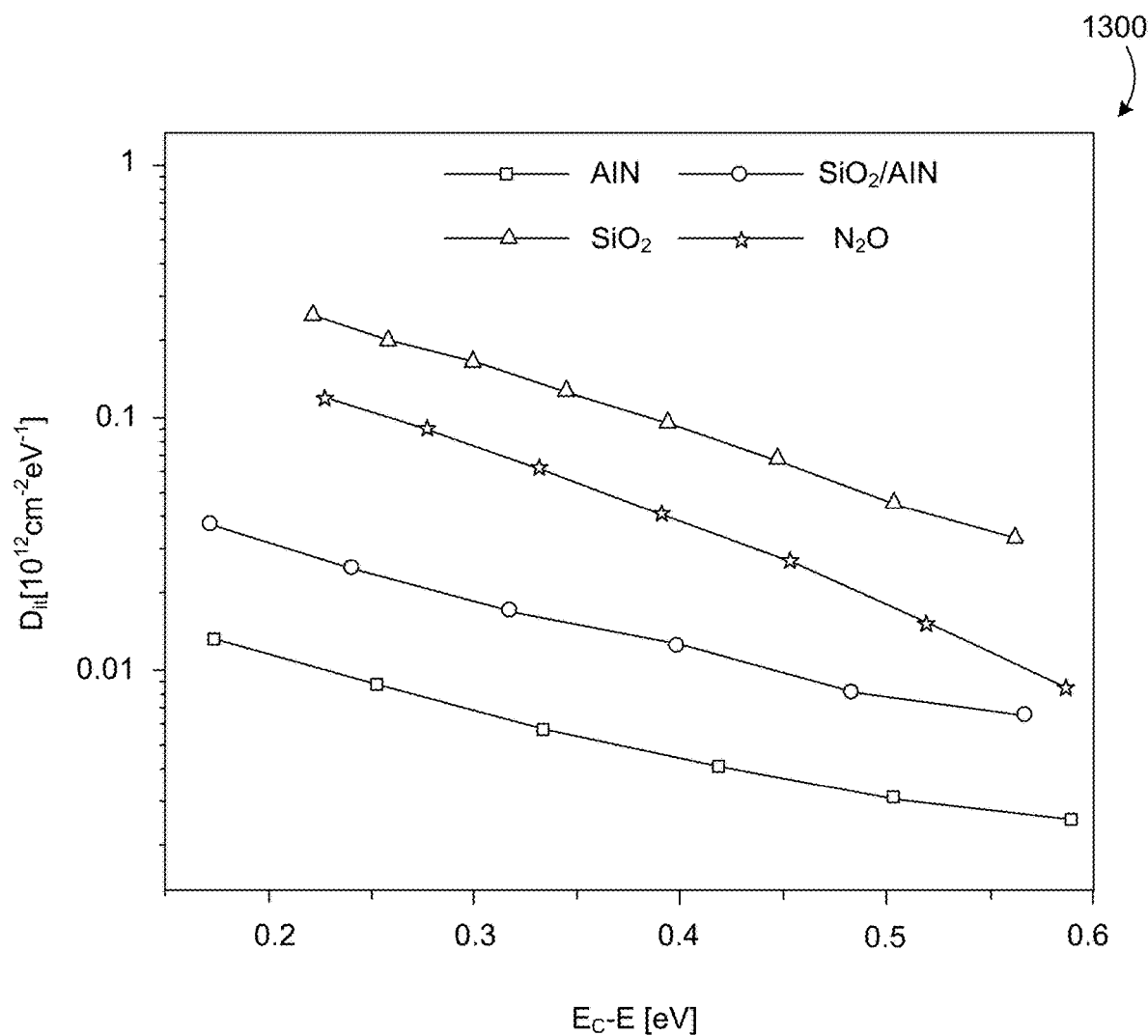
FIG. 13 is a graph that illustrates interface state densities for various materials with SiC.

FIG. 13 is a graph 1300 that illustrates interface state densities for various interface layer materials with SiC. As can be seen from FIG. 13, of the materials illustrated in the graph 1300, AlN has the lowest $D_{it}$ of those materials, which in some instances, is at least an order of magnitude less that other potential interface layer materials.

Figure 14:
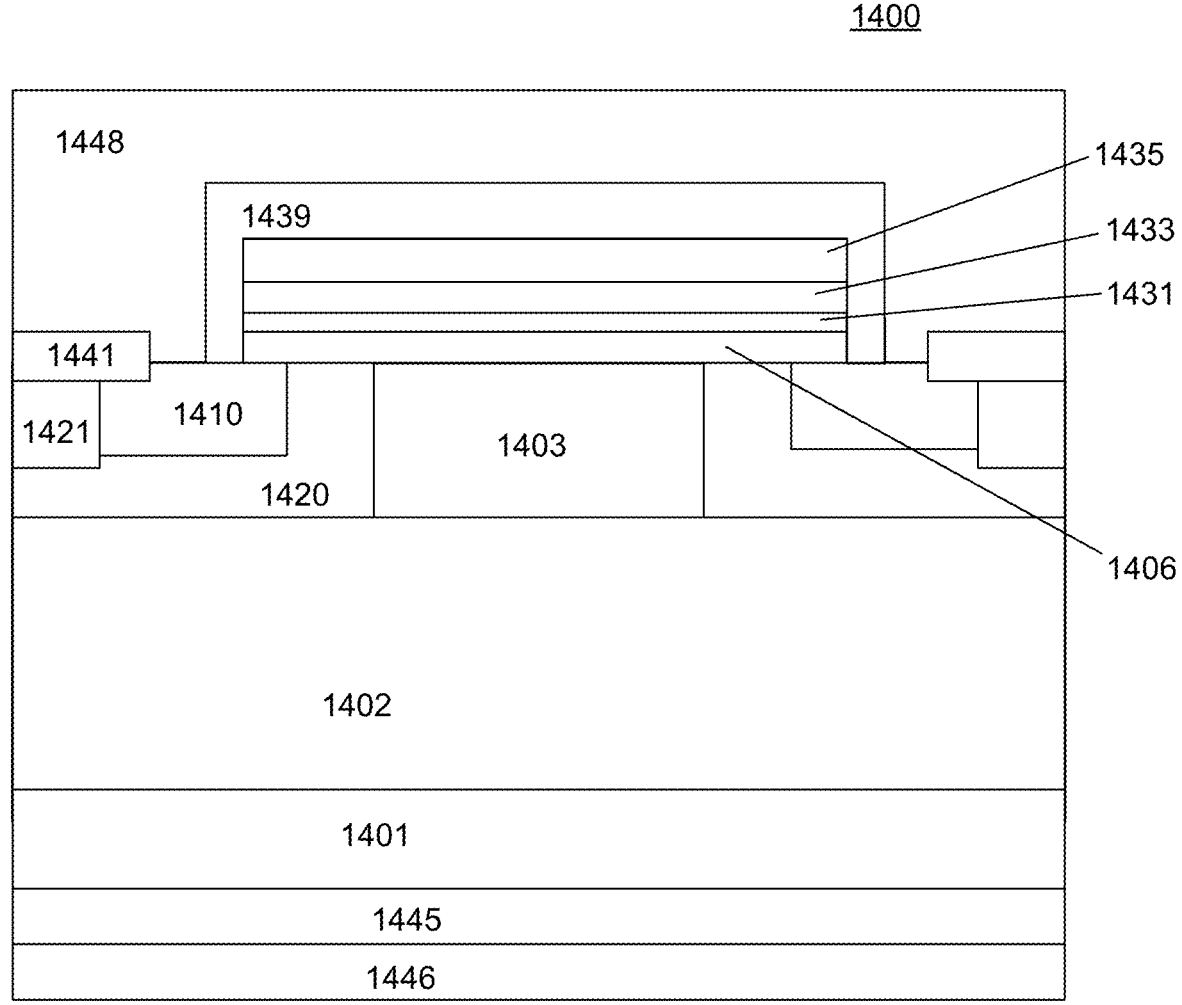
FIG. 14 is a diagram that schematically illustrates a side cross-sectional view of a silicon carbide (SiC) metal-oxide-semiconductor field-effect transistor (MOSFET), according to an implementation.

FIG. 14 is a diagram that schematically illustrates a side cross-sectional view of a silicon carbide (SiC) metal-oxide-semiconductor field-effect transistor (MOSFET) 1400, according to an implementation. For instance, FIG. 14 illustrates a cross-sectional view of an example implementation of a unit cell of the SiC MOSFET 1400. Similar to the FET 100 of FIG. 1, a unit cell of the MOSFET 1400, such as shown in FIG. 14, can be combined with other instances of the unit cell (e.g., in a similar arrangement as shown in FIG. 12) to form a SiC MOSFET that can be used in power applications, such as motor control drivers, industrial controls, etc.

In the MOSFET 1400, a work-function of p-GaN to SiC can be leveraged to produce a silicon carbide MOSFET with improved performance. For instance, current high-performance power SiC MOSFETs can have significant performance issues due to low threshold voltages of only a couple of volts. Also, undesirably high leakage current during an off-state of current SiC MOSFETs can be observed at elevated temperatures, e.g., after prolonged negative bias at the gate. Such bias tends to result in capturing of positive charge next to the SiC-to-oxide interface, leading to off-state leakage. These concerns present performance and reliability issues for current SiC MOSFETs.

In comparison, power SiC MOSFETs having higher threshold voltages tend to have increased channel resistance due to decreased inversion-layer mobility. While exact physical mechanisms of mobility degradation with increases of threshold voltage are not fully understood, inversion-layer mobility, e.g., in SiC MOSFETs is well established to be independent from a work-function of the gate. Accordingly, implementing a gate having a gate electrode (gate stack) that is formed using (includes) p-type GaN, rather than conventional polysilicon, can result in a MOSFET gate that has a higher work-function to n-type SiC and overcome at least some of the drawbacks of current SiC MOSFET implementations.

As shown in FIG. 14, the MOSFET 1400 can include a substrate 1401, a drift region 1402, a spreading layer 1403, a p-body 1420 and an n-source 1410. The MOSFET 1400 can further include a p+ subcontact layer 1421. The MOSFET 1400 also includes a gate oxide 1406. The gate oxide 1406 can have a thickness of between approximately 25 nm and 100 nm, and, in some implementations, can have a nitrided interface to SiC. Such a nitrided interface can be formed by annealing an oxidized SiC surface in an ambient containing nitric oxide (NO) or of dinitrogen monoxide (N$_2$O) at a temperature of between approximately 1100 C and 1400 C. Nitridation can decrease an interface state density in the gate oxide 1406 next to (at an interface with) the SiC surface.

MOSFET 1400 further includes an ALD-deposited intermediate layer of AlN 1433 and a gate of p-GaN 1435, which p-GaN can be crystalline or microcrystalline. The MOSFET 1400 can further include an Ohmic drain contact 1445, drain metal 1446, Ohmic contacts 1441 to a source (e.g., n-type) region 1410 and a body (e.g., p-type) region 1420, the p-GaN gate 1435, an interlayer dielectric 1439 and a source pad metal 1448. Under zero gate bias, the MOSFET 1400 is in an off-state, and it can block approximately a same voltage as the FET 100, as described herein, provided a doping concentration and thickness of the drift region 1402 are similar to those as described for the drift region 102 of the FET 100. A positive gate bias will induce an inversion electron channel at the interface of SiC to the oxide 1406, and, as a result, open (turn on) the MOSFET 1400. Accordingly, the high work-function of p-GaN to SiC can increase a threshold voltage of the MOSFET 1400, without significantly impacting an on-state resistance of the MOSFET 1400.

It will understood, for purposes of this disclosure, that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A silicon carbide (SiC) metal-oxide-semiconductor field-effect transistor (MOSFET) comprising:
    a SiC substrate of a first conductivity type;
    a drift region of the first conductivity type disposed on the SiC substrate;
    a spreading layer of the first conductivity type disposed in the drift region;
    a body region of a second conductivity type disposed in the spreading layer;
    a source region of the first conductivity type disposed in the body region; and
    a gate structure including:
        a gate oxide layer;
        an aluminum nitride (AlN) layer disposed on the gate oxide layer; and
        a gallium nitride (GaN) layer of the second conductivity type disposed on the AlN layer.

2. The SiC MOSFET of claim 1, wherein the drift region has a thickness of approximately 9.5 micrometers.

3. The SiC MOSFET of claim 1, wherein the drift region has a doping concentration of $1 \times 10^{16}$ cm$^{-3}$.

4. The SiC MOSFET of claim 1, wherein the drift region is an epitaxial SiC drift region.

5. The SiC MOSFET of claim 1, wherein the gate oxide layer has a thickness between 25 nanometers (nm) and 100 nm.

6. The SiC MOSFET of claim 1, further comprising:
    an Ohmic drain contact disposed on the SiC substrate;
    an interlayer dielectric disposed on the gate structure;
    a source metal structure including:
        an Ohmic contact layer, the Ohmic contact layer defining:
            an Ohmic contact to the body region; and
            an Ohmic contact to the source region; and
        a metal layer disposed on the Ohmic contact, a portion of the source region and the interlayer dielectric, the gate structure being electrically isolated from the metal layer by the interlayer dielectric.

7. The SiC MOSFET of claim 6, wherein the Ohmic contact to the body region includes a subcontact region of the second conductivity type disposed in the body region, the subcontact region having a doping concentration that is higher than a doping concentration of the body region.

8. The SiC MOSFET of claim 7, wherein the Ohmic contact layer is in contact with the subcontact region and the source region.

9. The SiC MOSFET of claim 6, further comprising a drain metal layer disposed on the Ohmic drain contact.

10. The SiC MOSFET of claim 1, further comprising a nitrided interface between the gate oxide layer and the spreading layer, and between the gate oxide layer and the source region.

11. The SiC MOSFET of claim 1, wherein the GaN layer is crystalline or microcrystalline.

12. The SiC MOSFET of claim 1, wherein the AlN layer is atomic layer deposited.

13. A silicon carbide (SiC) metal-oxide-semiconductor field-effect transistor (MOSFET) comprising:
    an n-type SiC substrate;
    an n-type drift region disposed on the n-type SiC substrate;
    an n-type spreading layer disposed in the drift region;
    a p-type body region disposed in the spreading layer;
    an n-type source region disposed in the body region; and
    a gate structure including:
        a gate oxide layer;
        an aluminum nitride (AlN) layer disposed on the gate oxide layer; and
        a p-type gallium nitride (GaN) layer disposed on the AlN layer.

14. The SiC MOSFET of claim 13, further comprising a nitrided interface between the gate oxide layer and the n-type spreading layer, and between the gate oxide layer and the n-type source region.

15. The SiC MOSFET of claim 13, wherein the n-type drift region has a thickness of approximately 9.5 micrometers.

16. The SiC MOSFET of claim 13, wherein the n-type drift region has a doping concentration of $1 \times 10^{16}$ cm$^{-3}$.

17. The SiC MOSFET of claim 13, wherein the gate oxide layer has a thickness between 25 nanometers (nm) and 100 nm.

18. The SiC MOSFET of claim 13, further comprising:
    an Ohmic drain contact disposed on the n-type SiC substrate;
    an interlayer dielectric disposed on the gate structure;
    a source metal structure including:
        an Ohmic contact layer, the Ohmic contact layer defining:
            an Ohmic contact to the p-type body region; and
            an Ohmic contact to the n-type source region; and
        a metal layer disposed on the Ohmic contact, a portion of the n-type source region and the interlayer dielectric, the gate structure being electrically isolated from the metal layer by the interlayer dielectric.

19. The SiC MOSFET of claim 18, wherein the Ohmic contact to the body region includes a p-type subcontact region disposed in the p-type body region, the p-type subcontact region having a doping concentration that is higher than a doping concentration of the p-type body region.

20. The SiC MOSFET of claim 19, wherein the Ohmic contact layer is in contact with the p-type subcontact region and the n-type source region.

\* \* \* \* \*